US012652834B2

(12) United States Patent
Yoo et al.

(10) Patent No.: US 12,652,834 B2
(45) Date of Patent: Jun. 9, 2026

(54) SEMICONDUCTOR DEVICES INCLUDING SILICON NITRIDE (SiN), SILICON OXYCARBIDE (SiOC), OR SILICON OXYCARBONITRIDE (SiOCN) LINERS

(71) Applicant: Samsung Electronics Co., Ltd., Suwon-si (KR)

(72) Inventors: Jiho Yoo, Suwon-si (KR); Kihyung Ko, Suwon-si (KR); Junsoo Kim, Suwon-si (KR); Hyunsup Kim, Suwon-si (KR); Jihoon Cha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 18/141,990

(22) Filed: May 1, 2023

(65) Prior Publication Data

US 2024/0136396 A1     Apr. 25, 2024
US 2024/0234500 A9     Jul. 11, 2024

(30) Foreign Application Priority Data

Oct. 25, 2022     (KR) ........................ 10-2022-0137933

(51) Int. Cl.

| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 64/01* | (2025.01) |

(52) U.S. Cl.
CPC ......... *H10D 62/116* (2025.01); *H10D 30/014* (2025.01); *H10D 30/031* (2025.01); *H10D 64/017* (2025.01); *H10D 30/43* (2025.01); *H10D 30/6735* (2025.01); *H10D 62/121* (2025.01)

(58) Field of Classification Search
CPC .. H10D 62/116; H10D 30/014; H10D 30/031; H10D 64/017; H10D 30/43; H10D 30/6735; H10D 62/121; H10D 30/797; H10D 30/6757; H10D 62/822; H10D 64/256; H10D 84/0151; H10D 84/038; H10D 84/83; H10D 84/834; H10D 30/62; H10D 62/115; B82Y 10/00; H01L 29/786; H01L 29/06; H01L 29/423; H01L 29/66; H01L 29/78
See application file for complete search history.

(56) References Cited

U.S. PATENT DOCUMENTS

| | | |
|---|---|---|
| 10,032,627 B2 | 7/2018 | Lee et al. |
| 10,529,830 B2 | 1/2020 | Tapily et al. |
| 10,535,550 B2 | 1/2020 | Belyansky et al. |

(Continued)

*Primary Examiner* — William B Partridge
*Assistant Examiner* — David Paul Sedorook
(74) *Attorney, Agent, or Firm* — Muir Patent Law, PLLC

(57) ABSTRACT

A semiconductor device may include an active pattern on a substrate; an isolation pattern on the substrate, the isolation pattern covering opposite sidewalls of the active pattern; a liner on the isolation pattern, a liner including a material different from the isolation pattern; a gate structure contacting an upper surface of the active pattern and an upper surface of the liner; and a plurality of channels spaced apart from each other in a vertical direction perpendicular to an upper surface of the substrate, each of the plurality of channels extending through the gate structure.

20 Claims, 33 Drawing Sheets

(56) References Cited

U.S. PATENT DOCUMENTS

| | | | |
|---|---|---|---|
| 11,232,988 B2 | 1/2022 | Shen et al. | |
| 2016/0315045 A1* | 10/2016 | Baek | H01L 21/76804 |
| 2021/0336012 A1* | 10/2021 | Huang | H10D 62/116 |
| 2022/0037340 A1 | 2/2022 | Yang et al. | |
| 2022/0037507 A1 | 2/2022 | More et al. | |
| 2022/0068715 A1 | 3/2022 | Waite et al. | |
| 2023/0180451 A1* | 6/2023 | Lin | H10D 84/85 |
| | | | 257/288 |
| 2023/0317810 A1* | 10/2023 | You | H10D 30/6735 |
| | | | 257/370 |

* cited by examiner

SEMICONDUCTOR DEVICES INCLUDING SILICON NITRIDE (SiN), SILICON OXYCARBIDE (SiOC), OR SILICON OXYCARBONITRIDE (SiOCN) LINERS

CROSS-REFERENCE TO RELATED APPLICATION(S)

This application claims priority under 35 U.S.C. § 119 to Korean Patent Application No. 10-2022-0137933 filed on Oct. 25, 2022 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a semiconductor device having one or more transistors.

DISCUSSION OF RELATED ART

In a semiconductor device including a plurality of channels vertically stacked, a dummy gate structure may be formed on an active pattern and an isolation pattern adjacent thereto. The isolation pattern may also be removed while removing the dummy gate structure, and accordingly, the active pattern may be exposed. The exposure of the active pattern may cause an increase in leakage current.

SUMMARY

Example embodiments provide a semiconductor device having improved characteristics.

According to example embodiments of the inventive concepts, there is a semiconductor device. The semiconductor device may include an active pattern on a substrate; an isolation pattern on the substrate, the isolation pattern covering opposite sidewalls of the active pattern; a liner on the isolation pattern, a liner including a material different from the isolation pattern; a gate structure contacting an upper surface of the active pattern and an upper surface of the liner; and a plurality of channels spaced apart from each other in a vertical direction perpendicular to an upper surface of the substrate, each of the plurality of channels extending through the gate structure.

According to example embodiments of the inventive concepts, there is a semiconductor device. The semiconductor device may include an active pattern on a substrate, the active pattern extending in a first direction parallel to an upper surface of the substrate; an isolation pattern on the substrate, the isolation pattern covering opposite sidewalls in a second direction of the active pattern, and the second direction parallel to the upper surface of the substrate and crossing the first direction; a liner on the isolation pattern, the liner extending in the first direction; a gate structure on the active pattern and the liner, the gate structure extending in the second direction; a plurality of channels spaced apart from each other in a vertical direction perpendicular to an upper surface of the substrate, each of the plurality of channels extending through the gate structure; and a source/drain layer on a portion of the active pattern adjacent in the first direction to the gate structure, the source/drain layer contacting the channels, wherein the liner includes silicon oxycarbide (SiOC), and a concentration of carbon in the liner is constant along the vertical direction.

According to example embodiments of the inventive concepts, there is a semiconductor device. The semiconductor device may include an active pattern on a substrate, the active pattern extending in a first direction parallel to an upper surface of the substrate; an isolation pattern on the substrate, the isolation pattern covering opposite sidewalls in a second direction of the active pattern, and the second direction parallel to the upper surface of the substrate and crossing the first direction; a liner on the isolation pattern, the liner extending in the first direction; a gate structure on the active pattern and the liner, the gate structure extending in the second direction; a plurality of channels spaced apart from each other in a vertical direction perpendicular to an upper surface of the substrate, each of the plurality of channels extending through the gate structure; and a source/drain layer on a portion of the active pattern adjacent in the first direction to the gate structure, the source/drain layer contacting the channels. Each of edge portions in the second direction of the liner: protrudes in the vertical direction, is higher than an upper surface of a middle portion in the second direction of the liner, and contacts opposite sidewalls, respectively in the second direction of the active pattern.

According to example embodiments, in the semiconductor device, a leakage current from the channel to the substrate may be reduced or prevented by forming the liner on the upper surface of the isolation pattern. Thus, the semiconductor device according to example embodiments may have improved electrical characteristics.

BRIEF DESCRIPTION OF THE DRAWINGS

FIGS. 5 to 31 are plan views and cross-sectional views illustrating a method of manufacturing a semiconductor device according to example embodiments.

DETAILED DESCRIPTION

A semiconductor device and a method of manufacturing the same in accordance with example embodiments will be described more fully hereinafter with reference to the accompanying drawings. Hereinafter in the specifications (and not necessarily in the claims), two directions among horizontal directions, which are substantially parallel to an upper surface of a substrate, that cross each other may be referred to as first and second directions D1 and D2, respectively, and a vertical direction, which is substantially perpendicular to the upper surface of the substrate, may be referred to as a third direction D3. In example embodiments, the first and second directions D1 and D2 may be substantially perpendicular to each other.

Figure 1:
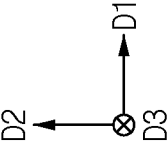
FIGS. 1 to 4 are a plan view and cross-sectional views illustrating a semiconductor device according to example embodiments.
Figure 2:
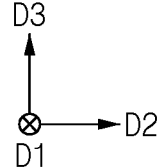
Figure 3:
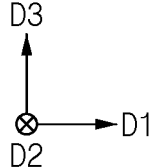
Figure 4:
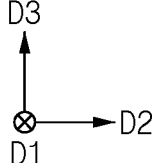

FIGS. 1 to 4 are a plan view and cross-sectional views illustrating a semiconductor device in accordance with example embodiments. FIG. 1 is the plan view, and FIGS. 2 to 4 are the cross-sectional views. FIG. 2 is a cross-sectional view taken along a line A-A' of FIG. 1, FIG. 3 is a cross-sectional view taken along a line B-B' of FIG. 1, and FIG. 3 is a cross-sectional view taken along a line C-C' of FIG. 1.

Referring to FIGS. 1 to 4, the semiconductor device may include an active pattern 102, an isolation pattern 130, a liner 415, a gate structure 340, a semiconductor pattern 124 and a source/drain layer 220.

The semiconductor device may further include a gate spacer 180, a capping pattern 345, a metal silicide pattern 360, a contact plug 370, and first and second insulating interlayers 280 and 350.

The substrate 100 may include or be formed of a semiconductor material, e.g., silicon, germanium, silicon-germanium, etc., or III-V semiconductor compounds, e.g., GaAs, AlGaAs, InAs, InGaAs, etc.

The active pattern 102 may protrude from the substrate 100 in the third direction D3, and may extend in the first direction D1. In the drawings, two active patterns 102 are shown, however, the inventive concepts may not be limited thereto. Thus, more than two active patterns 102 may be spaced apart from each other in the second direction D2.

The active pattern 102 may be formed by partially removing an upper portion of the substrate 100, and thus may include or be formed of a material substantially the same as that of the substrate 100. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

The isolation pattern 130 may cover opposite sidewalls in the second direction D2 of the active pattern 102, and may include or be formed of an oxide, e.g., silicon oxide.

The liner 415 may be formed on an upper surface of the isolation pattern 130, and may include a material different from the material of the isolation pattern 130. The liner 415 may include or be formed of, e.g., silicon nitride (SiN), silicon oxycarbide (SiOC), silicon oxycarbonitride (SiOCN) etc.

If the liner 415 includes silicon nitride (SiN), a concentration of nitrogen in the liner 415 may be substantially constant along the third direction D3. If the liner 415 includes silicon oxycarbide (SiOC) or silicon oxycarbonitride (SiOCN), a concentration of carbon in the liner 415 may be substantially constant along the third direction D3.

In example embodiments, an upper surface of the liner 415 may be formed at a substantially constant height.

In example embodiments, a first portion of the liner 415, which is beneath and in contact with the gate structure 340, may contact an upper sidewall of a first portion of the active pattern 102 adjacent to the first portion of the liner 415 in the second direction D2. An upper surface of the first portion of the liner 415 may be substantially coplanar with or lower than an upper surface of the first portion of the active pattern 102 adjacent to the first portion of the liner 415. In the drawings, the upper surface of the first portion of the liner 415 is lower than the upper surface of the first portion of the active pattern 102. In some embodiments, an upper surface of the liner 415 may be equal to an upper surface of the active pattern 102. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In example embodiments, a second portion of the liner 415, which is not covered by the gate structure 340 and in contact with the first insulating interlayer 280, may contact a lower sidewall of the source/drain layer 220 on a second portion of the active pattern 102 adjacent to the second portion of the liner 415 in the second direction D2. An upper surface of the second portion of the liner 415 may be higher than an upper surface of the second portion of the active pattern 102.

The gate structure 340 may surround a central portion in the first direction D1 of each of the semiconductor patterns 124. Thus, the gate structure 340 may cover lower and upper surfaces and opposite sidewalls in the second direction D2 of the central portion of each of the semiconductor patterns 124.

The gate structure 340 covers the semiconductor patterns 124 on two active patterns 102 disposed in the second direction D2, however, the inventive concept may not be limited thereto. For example, the gate structure 340 may extend in the second direction D2 on the substrate 100 on which the active pattern 102 and the isolation pattern 130 are formed, and may cover the semiconductor patterns 124 on more than two active patterns 102 spaced apart from each other in the second direction D2.

Additionally, two gate structures 340 are formed in the first direction D1 on the substrate 100 in the drawings, however, the inventive concept may not be limited thereto, and more than two gate structures 340 may be formed in the first direction D1.

The gate structure 340 may include a gate insulation pattern 310, a gate barrier 320 and a gate electrode 330 sequentially stacked, and the gate barrier 320 and the gate electrode 330 may collectively form a gate electrode structure. In some embodiments, an interface pattern 300 may be formed between the gate insulation pattern 310 and an upper surface and an upper sidewall of the active pattern 102 and between the gate insulation pattern 310 and a surface of each of the semiconductor patterns 124. The interface pattern 300 may include or be formed of an oxide, e.g., silicon oxide.

The gate insulation pattern 310 may be formed on the upper surface of the liner 415, the upper surface and the sidewall of the active pattern 102, the surface of each of the semiconductor patterns 124, a sidewall of the source/drain layer 220 and an inner sidewall of the gate spacer 180, the gate barrier 320 may be formed on the gate insulation pattern 310, and the gate electrode 330 may fill a space between the semiconductor patterns 124 spaced apart from each other in the third direction D3, a space between the lowermost one of the semiconductor patterns 124 and the active pattern 102, and a space between the gate spacers 180 on an uppermost one of the semiconductor patterns 124.

The gate insulation pattern 310 may include or be formed of a metal oxide having a high dielectric constant, e.g., hafnium oxide, tantalum oxide, zirconium oxide, etc., the gate barrier 320 may include or be formed of, e.g., titanium nitride, tantalum nitride, tungsten nitride, aluminum oxide, etc., and the gate electrode 330 may include or be formed of a metal, e.g., titanium, aluminum, etc., a metal alloy, a metal nitride or a metal carbide.

A plurality of semiconductor patterns 124 may be formed at a plurality of levels, respectively, over the upper surface of the active pattern 102 to be spaced apart from each other in the third direction D3, and each of the semiconductor patterns 124 may extend in the first direction D1. In the drawings, two semiconductor patterns 124 are spaced apart from each other in the first direction D1 at each level on the active pattern 102 extending in the first direction D1, however, the inventive concept may not be limited thereto, and more than two semiconductor patterns 124 may be spaced apart from each other in the first direction D1 at each level on the active pattern 102.

In example embodiments, the semiconductor pattern 124 may include or be formed of nano-sheets or nano-wires containing a semiconductor material, e.g., silicon, germanium, etc. In example embodiments, the semiconductor pattern 124 may serve as a channel of a transistor, and thus may be referred to as the channel.

The gate spacer 180 may cover each of opposite sidewalls in the first direction D1 of an upper portion of the gate structure 340 on the uppermost one of the semiconductor patterns 124.

The source/drain layer 220 may be formed on the active pattern 102 of the substrate 100 between the gate structures 340, and may commonly contact each of opposite sidewalls in the first direction D1 of the semiconductor patterns 124 at a plurality of levels, respectively, and may be connected thereto.

In an example embodiment, the source/drain layer 220 may include or be formed of single crystalline silicon-germanium doped with p-type impurities. A cross-section in the second direction D2 of the source/drain layer 220 may have a shape of a polygon such as a pentagon or a hexagon.

In another example embodiment, the source/drain layer 220 may include or be formed of single crystalline silicon doped with n-type impurities or single crystalline silicon carbide doped with n-type impurities. The cross-section in the second direction D2 of the source/drain layer 220 may have a shape of a rectangle with rounded corners.

The first insulating interlayer 280 may cover a sidewall of the gate spacer 180 and an upper surface of the source/drain layer 220. The second insulating interlayer 350 may be formed on the first insulating interlayer 280. Each of the first and second insulating interlayers 280 and 350 may include or be formed of an oxide, e.g., silicon oxide, or a low-k dielectric material.

The contact plug 370 may extend through the first and second insulating interlayers 280 and 350 to contact an upper portion of the source/drain layer 220. The metal silicide pattern 360 may be formed between the contact plug 370 and the source/drain layer 220. A bottom surface of the contact plug 370 may be substantially coplanar with or lower than the upper surface of the source/drain layer 220.

The contact plug 370 may include or be formed of, e.g., a metal, and/or a metal nitride, and the metal silicide pattern 360 may include or be formed of, e.g., cobalt silicide, nickel silicide, titanium silicide, etc.

Figure 14:
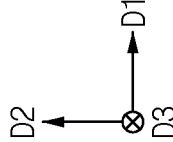
Figure 15:
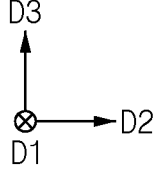
Figure 16:
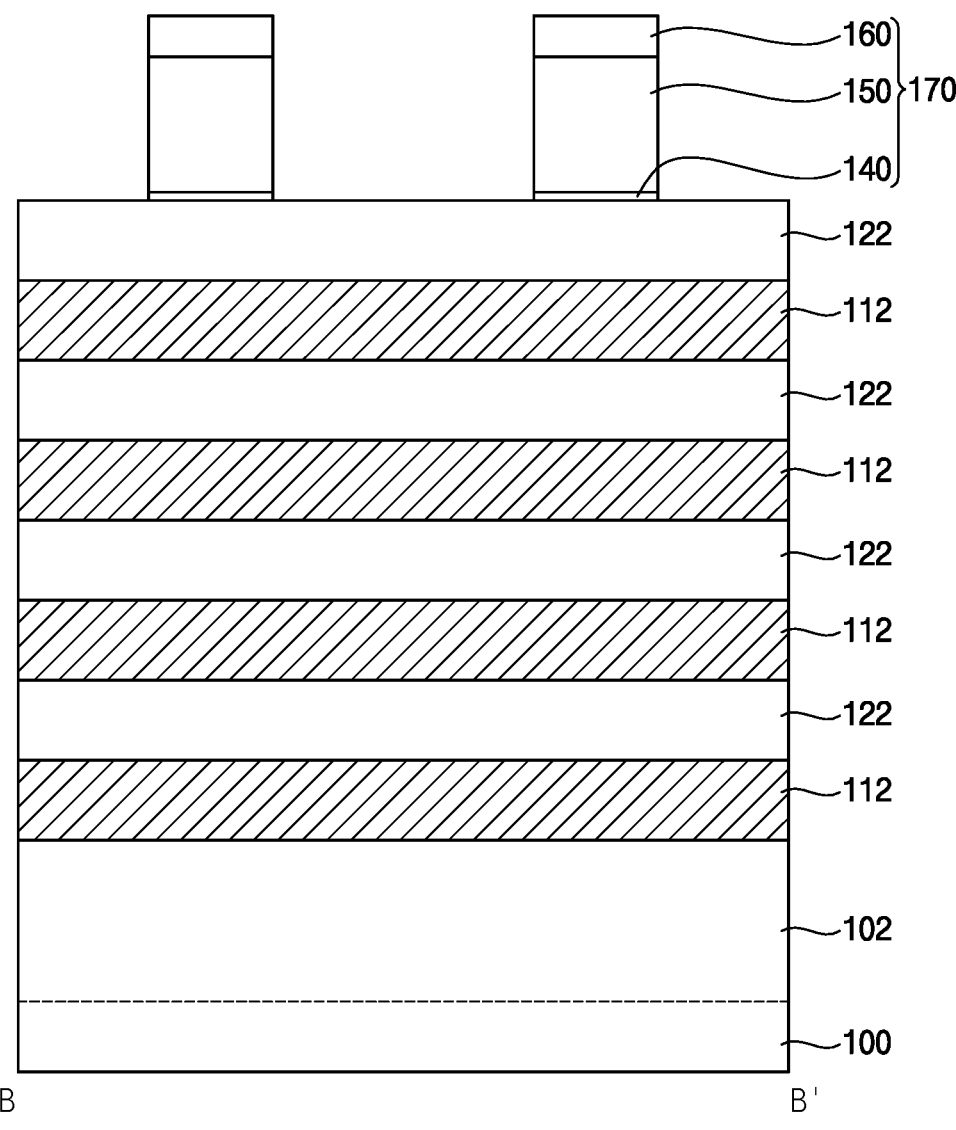
Figure 16:
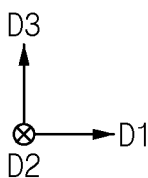
Figure 17:
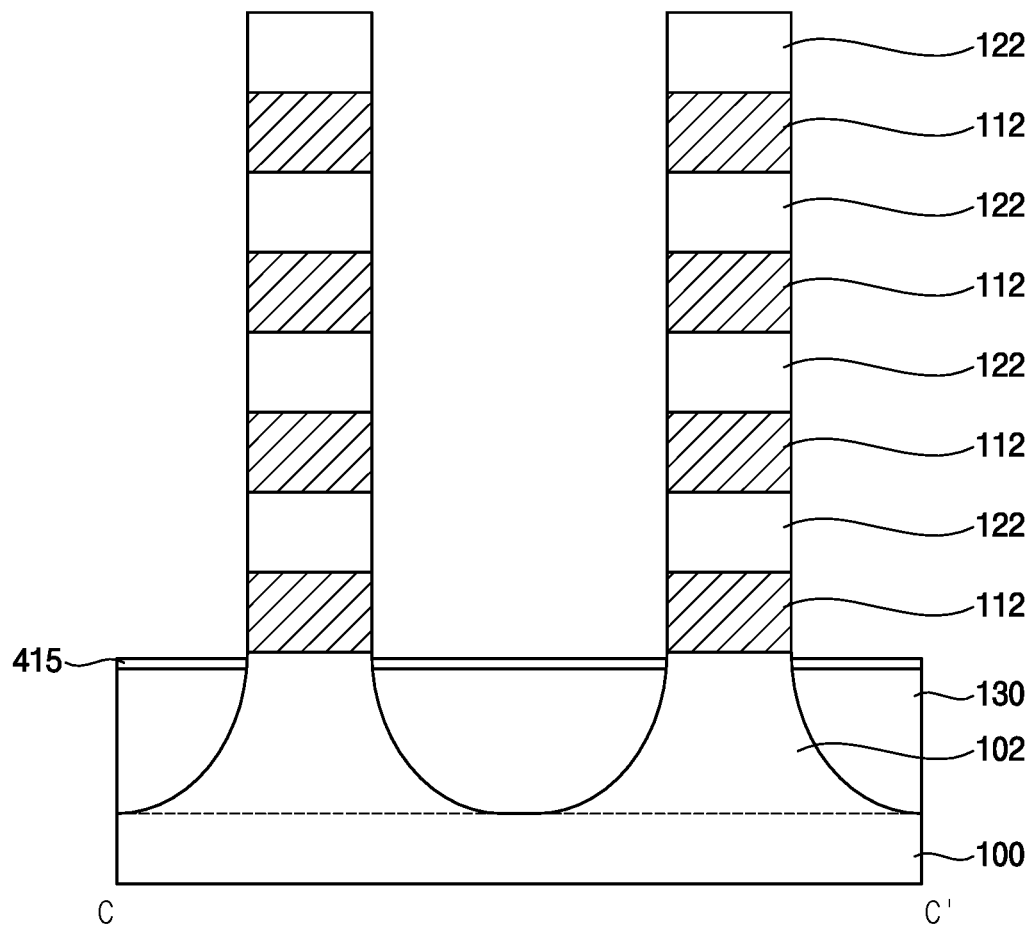
Figure 17:
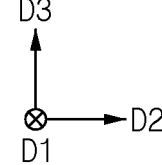

In the semiconductor device, the liner 415 including a different material from the isolation pattern 130 may be formed on the isolation pattern 130. As described below, while removing a dummy gate structure 170 (refer to FIGS. 14 to 16) including a dummy gate insulation pattern 140, which may be formed before the gate structure 340, the isolation pattern 130 may not be removed together with the dummy gate insulation pattern 140 including a material substantially the same as or similar to that of the isolation pattern 130.

Accordingly, the active pattern 102 covered by the isolation pattern 130 may not be exposed, and leakage current from an exposed portion of the active pattern 102 may be reduced or prevented.

FIGS. 5 to 31 are plan views and cross-sectional views illustrating a method of manufacturing a semiconductor device in accordance with example embodiments. Particularly, FIGS. 5, 8, 14, 18, 21 and 29 are the plan views, and FIGS. 6-7, 9-13, 15-17, 19-20, 22-28, 30 and 31 are the cross-sectional views.

FIGS. 6, 9, 11-13, 15, 24, 26, and 30 are cross-sectional views taken along lines A-A' of corresponding plan views, respectively, FIGS. 7, 10, 16, 19, 22, 25, 27 and 31 are cross-sectional views taken along lines B-B' of corresponding plan views, respectively, and FIGS. 17, 20, 23, and 28 are cross-sectional views taken along lines C-C' of corresponding plan views, respectively.

Figure 5:
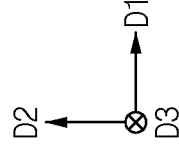
Figure 7:
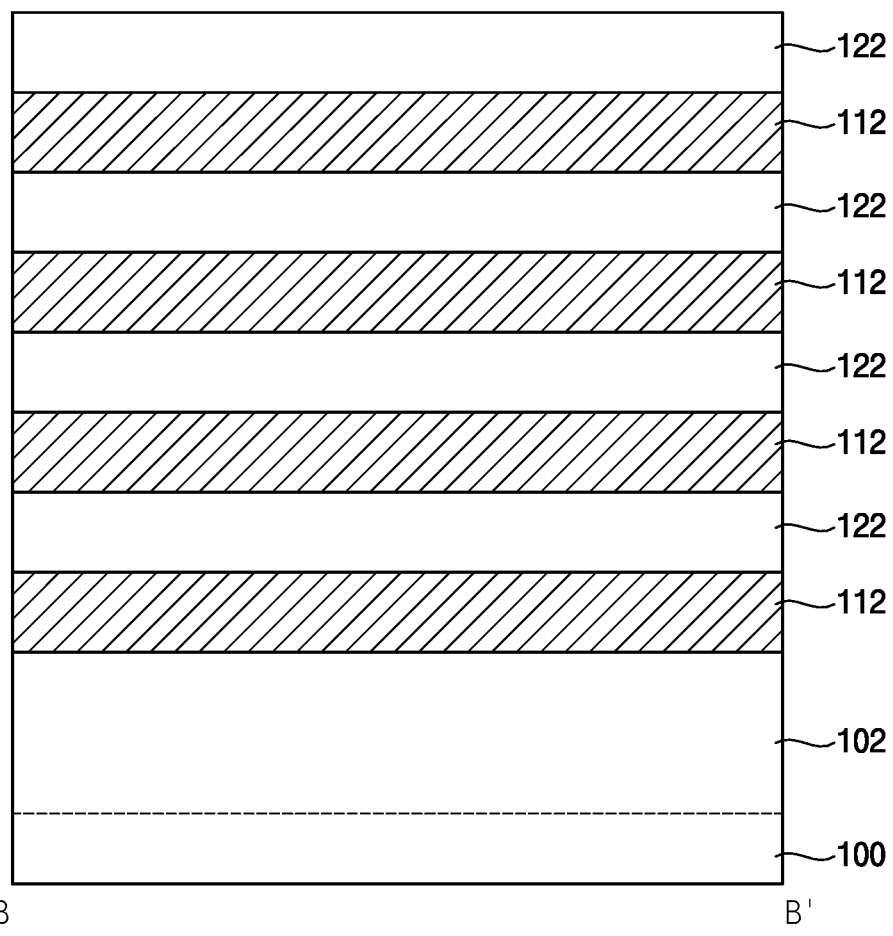
Figure 7:
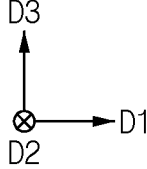

Referring to FIGS. 5 and 7, a sacrificial layer and a semiconductor layer may be alternately and repeatedly stacked on a substrate 100.

The substrate 100 may include or be formed of silicon, germanium, silicon-germanium, or a group III-V compound such as GaP, GaAs, or GaSb. In some example embodiments, the substrate 100 may be a Silicon-On-Insulator (SOI) substrate or a Germanium-On-Insulator (GOI) substrate.

Figure 6:
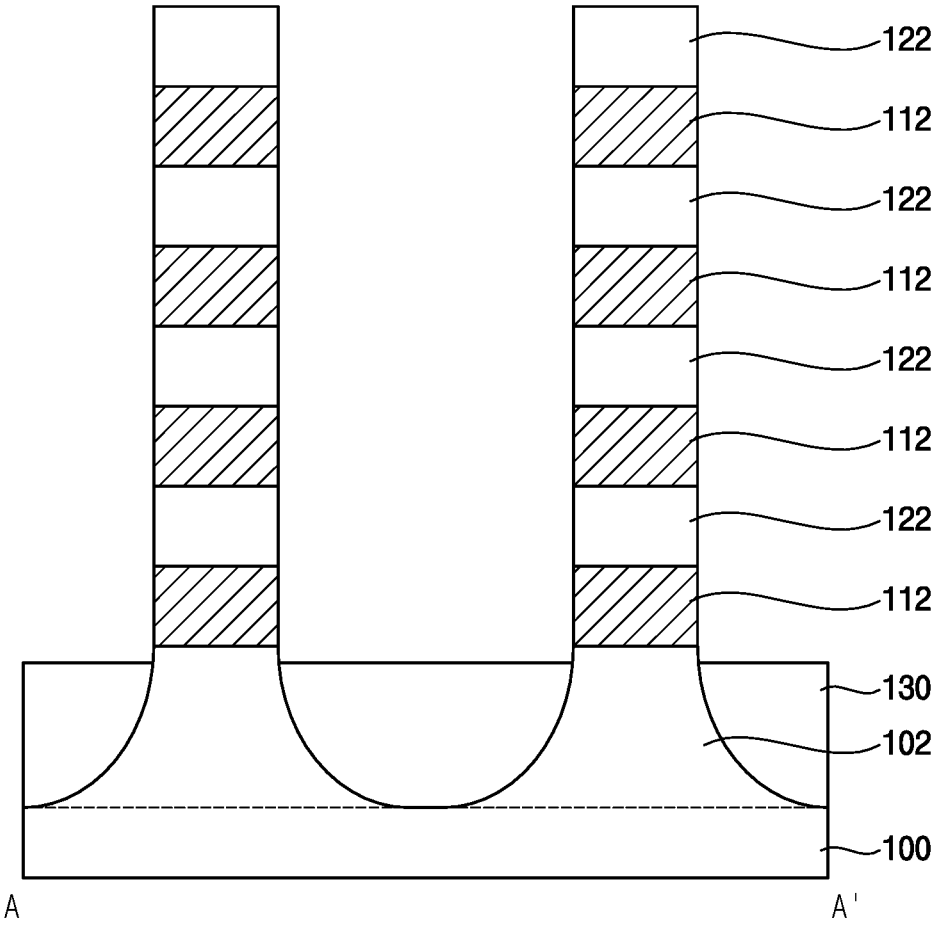
Figure 6:
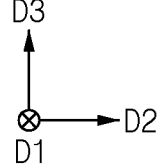

The semiconductor layer may include or be formed of, e.g., silicon, and the sacrificial layer may include or be formed of a material having an etching selectivity with respect to the substrate 100 and the semiconductor layer, e.g., silicon-germanium. FIGS. 6 and 7 show that four sacrificial layers and four semiconductor layers are formed at four levels, respectively, however, the inventive concept may not be limited thereto.

A first etching mask extending in the first direction D1 may be formed on an uppermost one of the semiconductor layers, and the semiconductor layers, the sacrificial layers and an upper portion of the substrate 100 may be etched using the first etching mask.

Thus, an active pattern 102 may be formed on the substrate 100 to extend in the first direction D1, and a stack structure including sacrificial lines 112 and semiconductor lines 122 alternately and repeatedly stacked may be formed on the active pattern 102. In an example embodiment, the sacrificial lines 112 and semiconductor lines 122 may include or be formed of silicon and silicon-germanium, respectively. The stack structure may protrude in the third direction D3 from the substrate 100, and thus the stack structure may also be referred to as a fin structure.

In example embodiments, a plurality of active patterns 102 may be spaced apart from each other in the second direction D2 on the substrate 100. Thus, a plurality of stack structures may also be spaced apart from each other in the second direction D2 on the substrate 100.

An isolation pattern 130 may be formed on the substrate 100 to cover a sidewall of the active pattern 102. In an example embodiment, the isolation pattern 130 may cover an entire portion of the sidewall in the second direction D2 of the active pattern 102. In another example embodiment, the isolation pattern 130 may cover only a lower portion of the sidewall in the second direction D2 of the active pattern 102, and an upper portion of the sidewall in the second direction D2 of the active pattern 102 may not be covered by the isolation pattern 130, as in FIG. 6. The isolation patterns 130 may include or be formed of oxide, e.g., silicon oxide ($SiO_2$).

Figure 8:
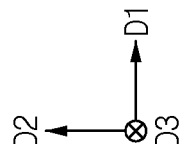
Figure 9:
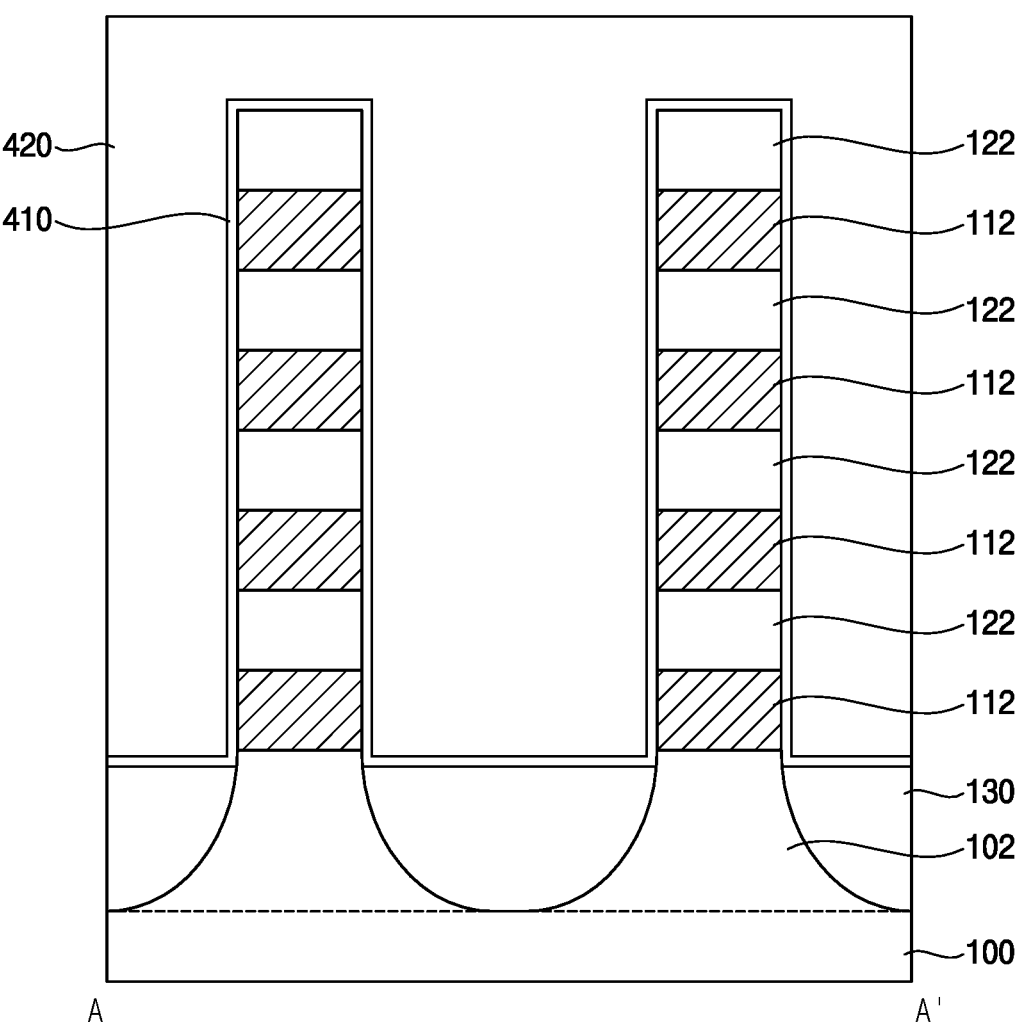
Figure 9:
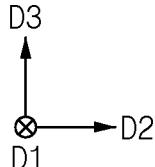
Figure 10:
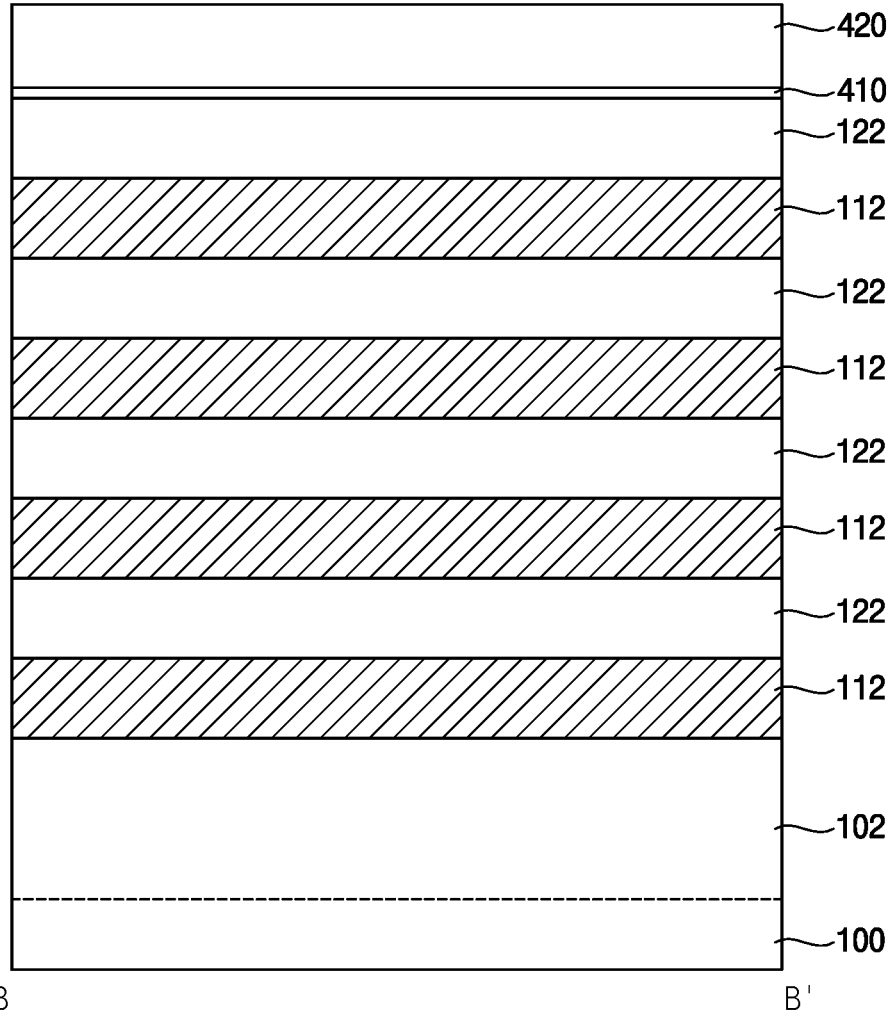
Figure 10:
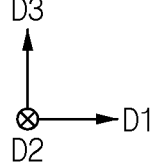

Referring to FIGS. 8 to 10, a liner layer 410 may be formed on an upper surface of the isolation pattern 130, the upper portion of the sidewall in the second direction D2 of the active pattern 102, and a sidewall and an upper surface of the stack structure.

The liner layer 410 may include or be formed of, e.g., a material having a high etching selectivity with respect an oxide included in the isolation pattern 130. The liner layer 410 may be formed by, e.g., a chemical vapor deposition (CVD) process, an atomic layer deposition (ALD) process, or an physical vapor deposition (PVD) process.

In example embodiments, the liner layer 410 may include or be formed of silicon nitride (SiN). The liner layer 410 is formed by a deposition process, and thus a concentration of nitrogen in the liner layer 410 may be substantially constant along the third direction D3.

In other example embodiments, the liner layer 410 may include or be formed of silicon oxycarbide (SiOC) or silicon oxycarbonitride (SiOCN). The liner layer 410 is formed by a deposition process, and thus a concentration of carbon in the liner layer 410 may be substantially constant along the third direction D3.

Sacrificial oxide layer 420 may be formed on the liner layer 410. The sacrificial oxide layer 420 may include or be formed of oxide, e.g., silicon oxide. The sacrificial oxide layer 420 may be formed by, e.g., a chemical vapor deposition (CVD) process, an atomic layer deposition (ALD) process, or a physical vapor deposition (PVD) process.

Figure 11:
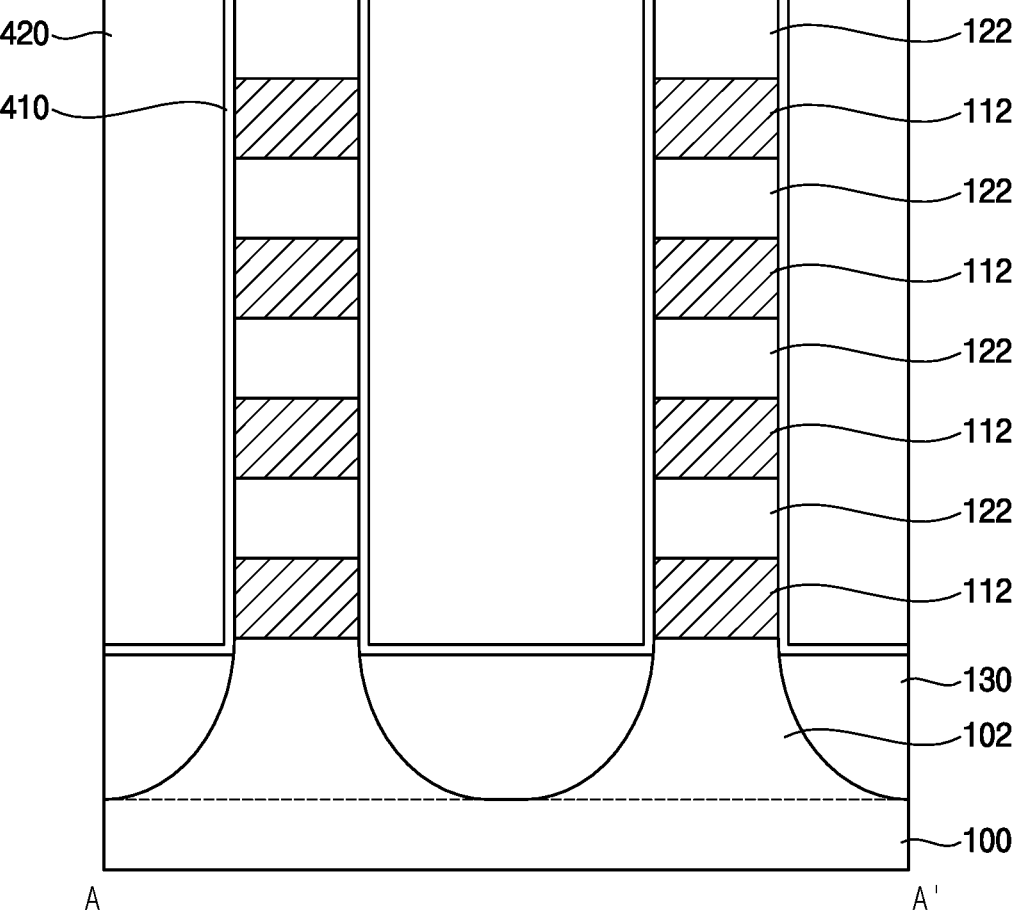
Figure 11:
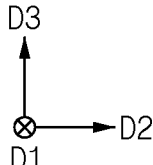

Referring to FIG. 11, the sacrificial oxide layer 420 and the liner layer 410 may be planarized until the upper surface of the stack structure is exposed.

In example embodiments, the planarization process may be performed by a chemical mechanical polishing (CMP) process and/or an etch back process.

The planarization process may be performed until an upper surface of the liner layer 410 on the isolation pattern 130 is exposed.

Figure 12:
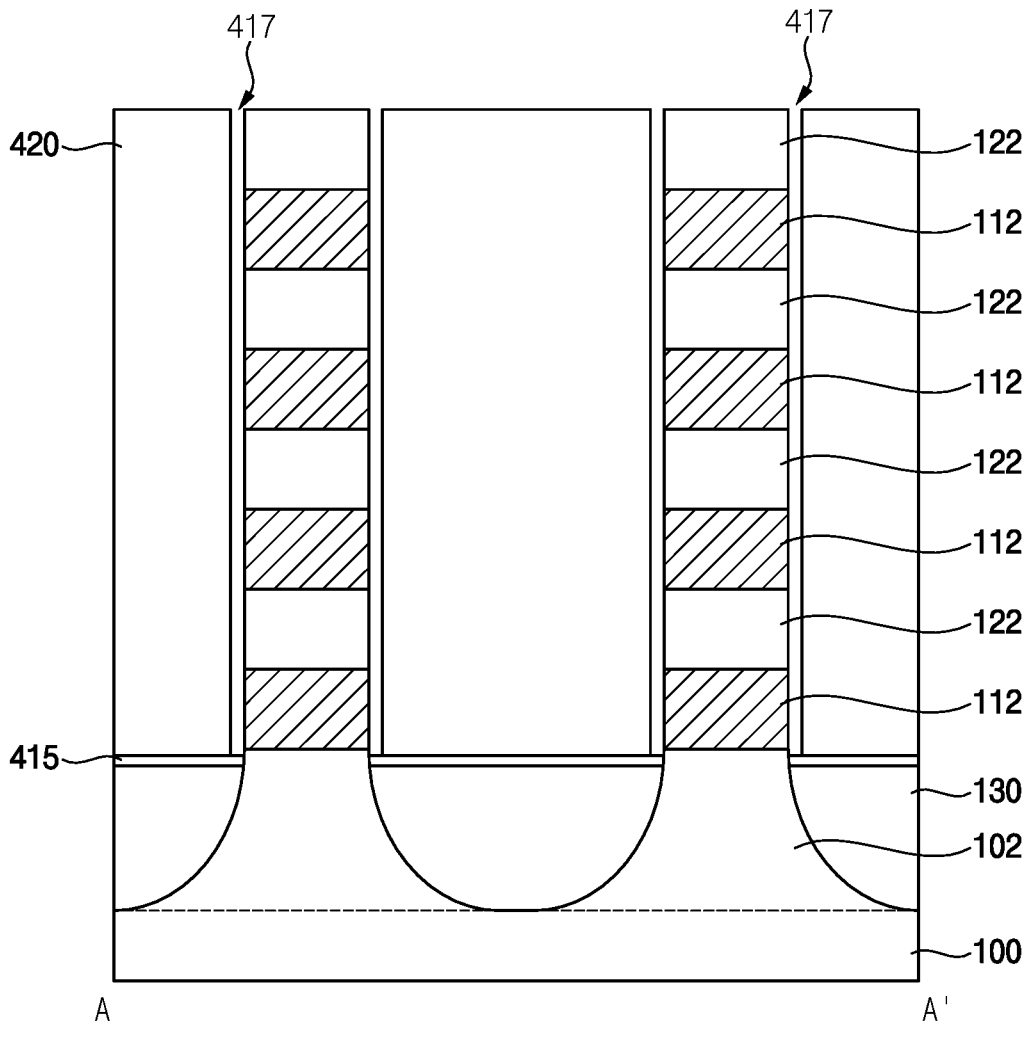
Figure 12:
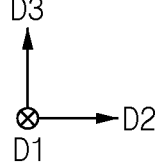

Referring to FIG. 12, a portion of the liner layer 410 on the sidewall of the stack structure and the upper portion of the sidewall of the active pattern 102 may be removed to form a first recess 417, and a remaining portion of the liner layer 410 may be transformed into a liner 415.

The portion of the liner layer 410 may be removed by, e.g., a wet etching process and/or a dry etching process.

The liner 415 may be formed on the isolation pattern 130, and may extend in the first direction D1. The upper surface of the liner 415 may be substantially coplanar with or lower than the upper surface of the active pattern 102. For example, FIG. 12 shows that the upper surface of the liner 415 is lower than the upper surface of the active pattern 102, however, if the liner 415 is formed to be thicker, the upper surface of the liner 415 may be substantially coplanar with the upper surface of the active pattern 102.

The liner 415 may contact the upper portion of the sidewall in the second direction D2 of the active pattern 102.

In example embodiments, the upper surface of the liner 415 may have a substantially constant height.

Figure 13:
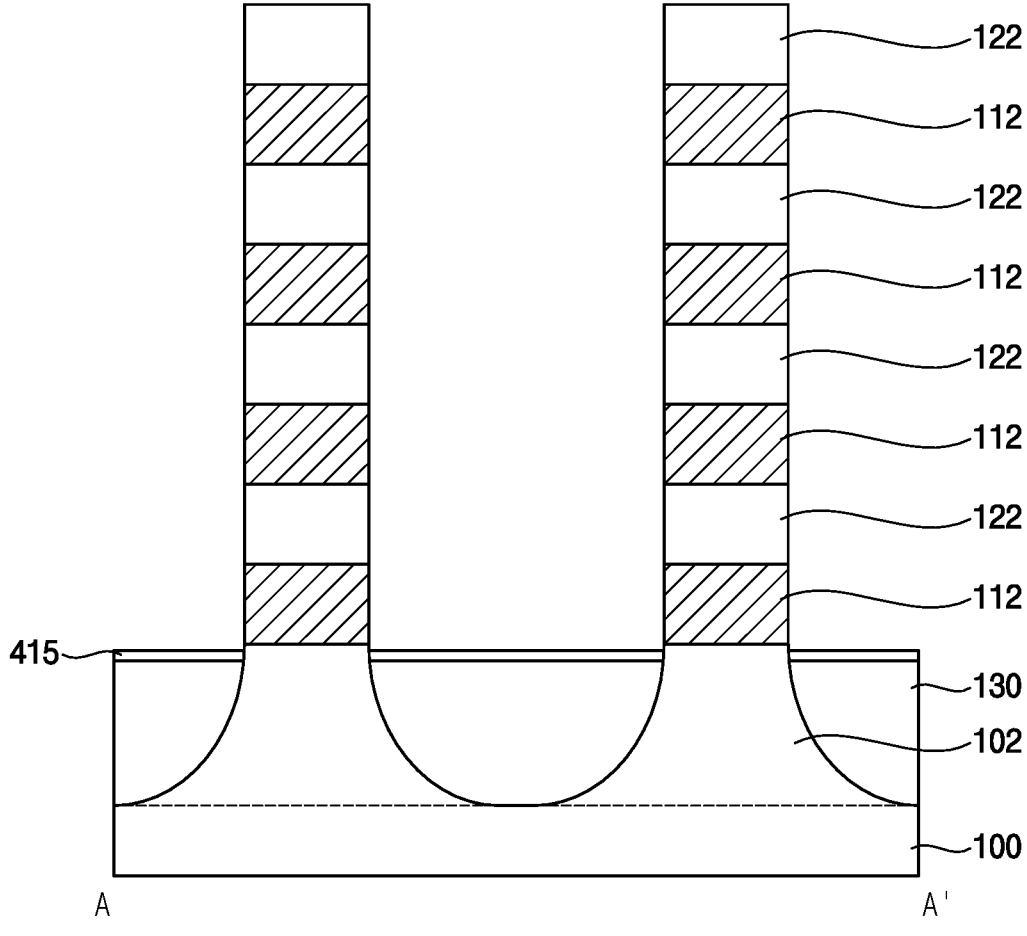
Figure 13:
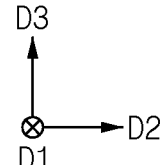

Referring to FIG. 13, the sacrificial layer 420 may be removed to expose the upper surface of the liner 415.

The sacrificial layer 420 may be removed by, e.g., a wet etching process and/or a dry etching process.

Referring to FIGS. 14 to 17, a dummy gate structure 170 may be formed on the substrate 100 to partially cover the stack structure and the liner 415.

Particularly, a dummy gate insulation layer, a dummy gate electrode layer and a dummy gate mask layer may be sequentially formed on the substrate 100 having the stack structure and the liner 415 thereon, an etching mask extending in the second direction D2 may be formed on the dummy gate mask layer, and the dummy gate mask layer may be etched using the etching mask to form a dummy gate mask 160.

The dummy gate insulation layer may include or be formed of an oxide, e.g., silicon oxide, the dummy gate electrode layer may include or be formed of, e.g., polysilicon, and the dummy gate mask layer may include or be formed of a nitride, e.g., silicon nitride.

The dummy gate electrode layer and the dummy gate insulation layer may be etched using the dummy gate mask 160 as an etching mask to form a dummy gate electrode 150 and a dummy gate insulation pattern 140, respectively.

The dummy gate insulation pattern 140, the dummy gate electrode 150 and the dummy gate mask 160 sequentially stacked on the active pattern 102 and a portion of the liner 415 adjacent to the active pattern 102 in the second direction D2 may form a dummy gate structure 170. In example embodiments, the dummy gate structure 170 may extend in the second direction D2 on the stack structure and the liner 415, and may cover the upper surface of the stack structure and opposite sidewalls in the second direction D2 of the stack structure.

In example embodiments, a plurality of the dummy gate structures 170 may be spaced apart from each other in the first direction D1. In FIGS. 14 to 17, two dummy gate structures 170 are spaced apart from each other in the first direction D1, however the inventive concept may not be limited thereto. Also, in the drawings, the dummy gate structure 170 extends continuously in the second direction D2, however the inventive concept may not be limited thereto, and in some embodiments, a plurality of the dummy gate structures 170 may be spaced apart from each other in the second direction D2.

Figure 18:
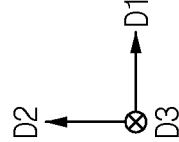
Figure 19:
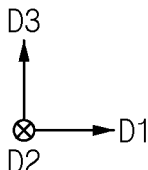
Figure 20:
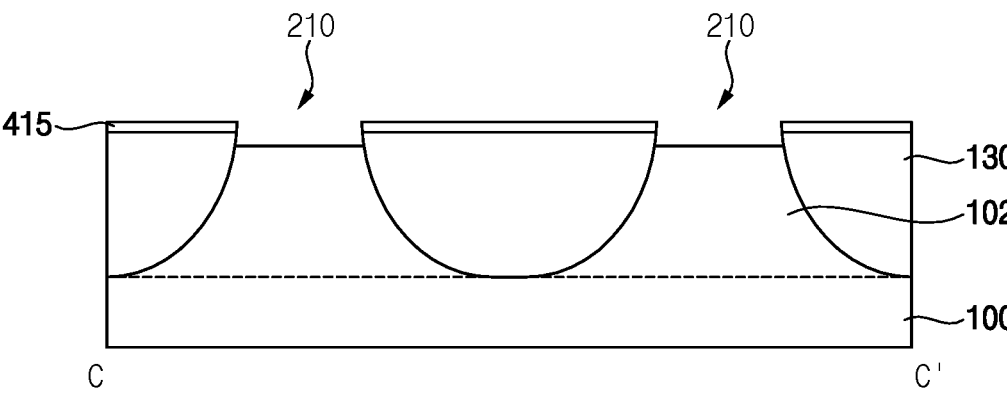
Figure 20:
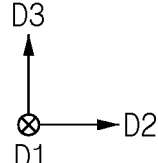

Referring to FIGS. 18 to 20, a gate spacer 180 may be formed on a sidewall of the dummy gate structure 170.

Particularly, a spacer layer may be formed on the stack structure, the liner 415 and the dummy gate structure 170, and anisotropically etched to form the gate spacer 180 covering each of opposite sidewalls in the first direction D1 of the dummy gate structure 170.

The stack structure and an upper portion of the active pattern 102 thereunder may be etched using the dummy gate structure 170 and the gate spacer 180 as an etching mask to form a first opening 210. Thus, an upper surface of a portion of the active pattern 102 between the dummy gate structure 170 may be lower than the upper surface of the isolation pattern.

Thus, the sacrificial lines 112 and the semiconductor lines 122 under the dummy gate structure 170 and the gate spacer 180 may be transformed into sacrificial patterns 114 and semiconductor patterns 124, respectively, and the stack structure extending in the first direction D1 may be divided into a plurality of pieces spaced apart from each other in the first direction D1. Hereinafter, the dummy gate structure 170, the gate spacers 180 on the opposite sidewalls in the first direction D1 of the dummy gate structure 170, and the stack structure may be referred to as a first structure. In example embodiments, the first structure may extend in the second direction D2, and a plurality of first structures may be spaced apart from each other in the first direction D1.

Figure 21:
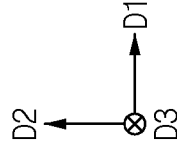
Figure 22:
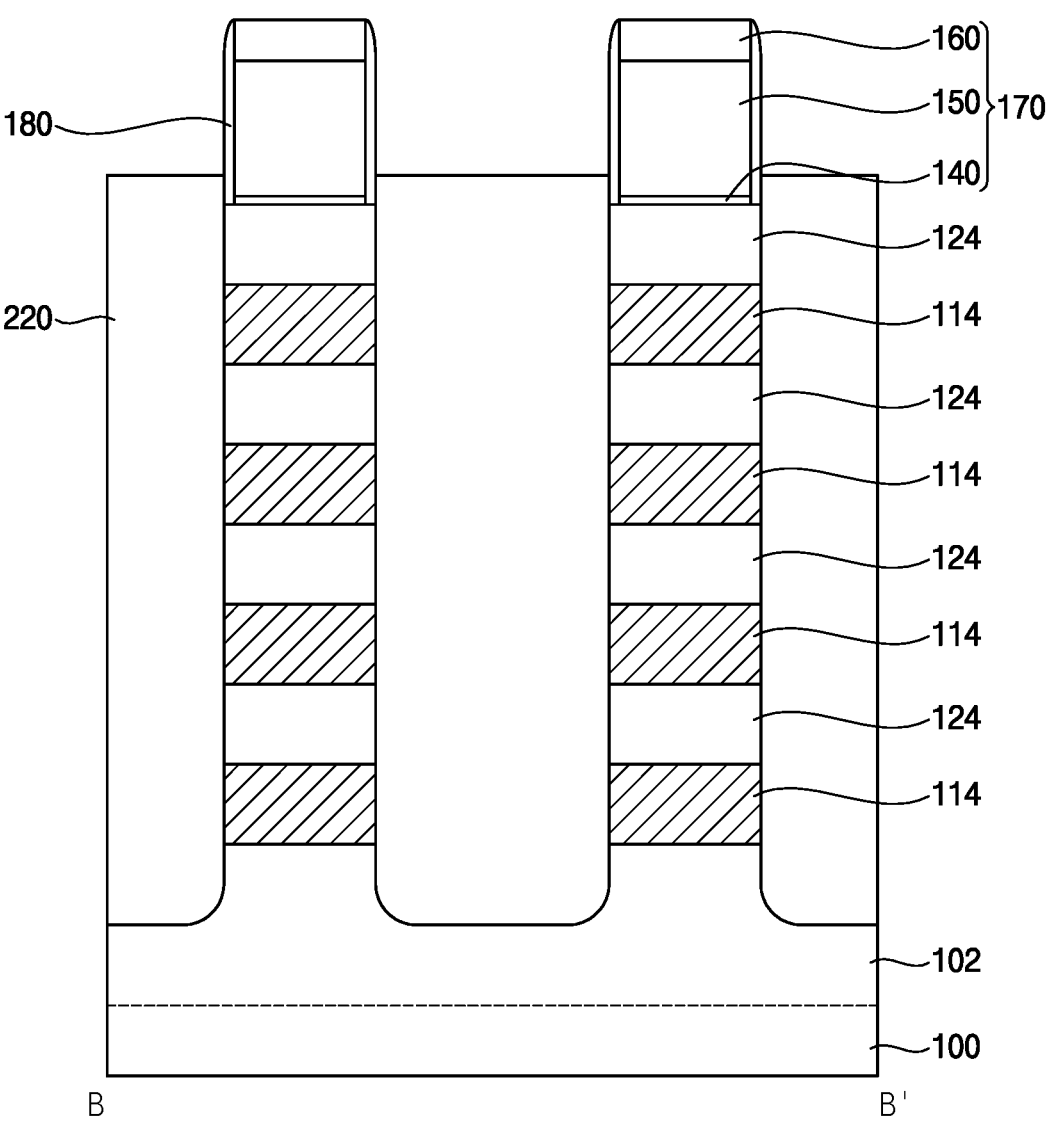
Figure 22:
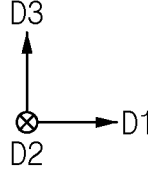
Figure 23:
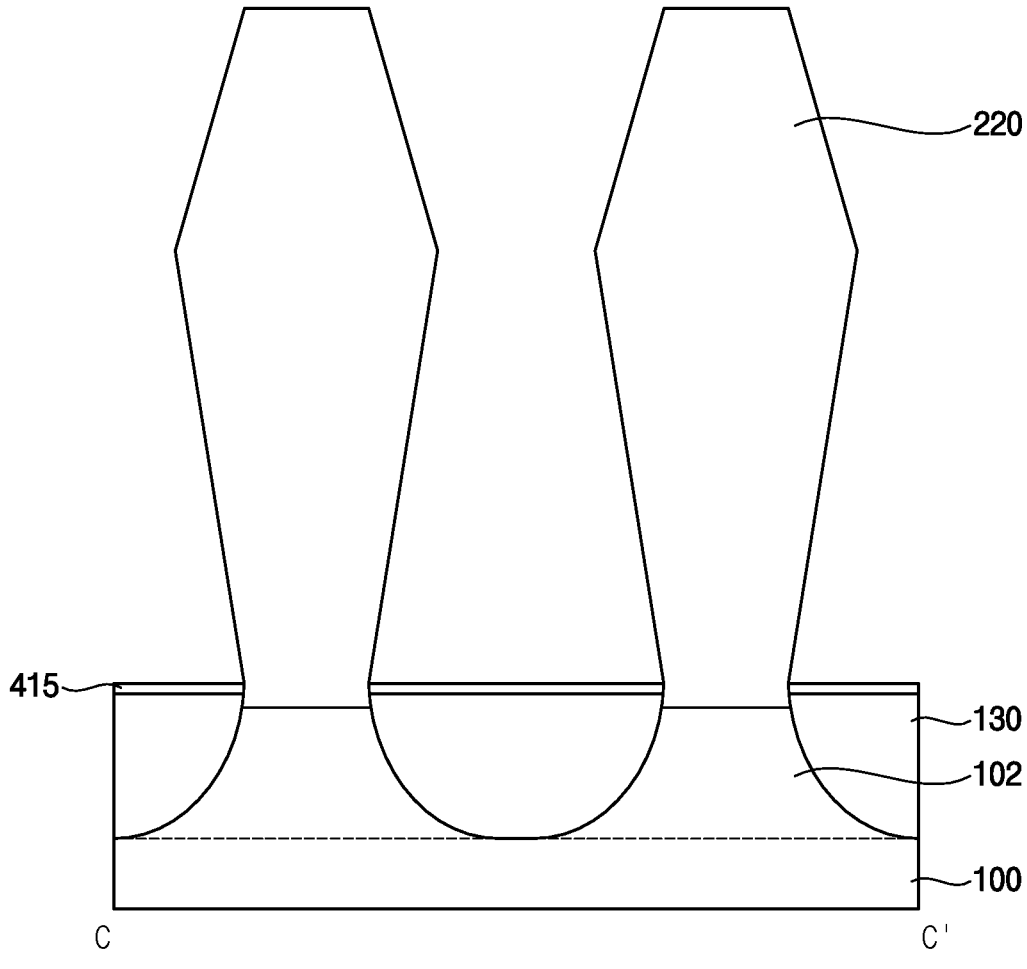
Figure 23:
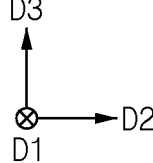

Referring to FIGS. 21 to 23, a selective epitaxial growth (SEG) process may be performed using sidewalls of the semiconductor patterns 124 and the sacrificial patterns 114 and the upper surface of the active pattern 102 exposed by the first opening 210 as a seed to form a source/drain layer 220 on an inner wall of the first opening 210.

In an example embodiment, the source/drain layer 220 may include or be formed of single crystalline silicon-germanium doped with p-type impurities. The cross-section in the second direction D2 of the source/drain layer 220 may have a shape of a polygon such as a pentagon or a hexagon.

In another example embodiment, the source/drain layer 220 may include or be formed of single crystalline silicon doped with n-type impurities or single crystalline silicon carbide doped with n-type impurities. The cross-section in the second direction D2 of the source/drain layer 220 may have a shape of a rectangle with rounded corners.

Figure 24:
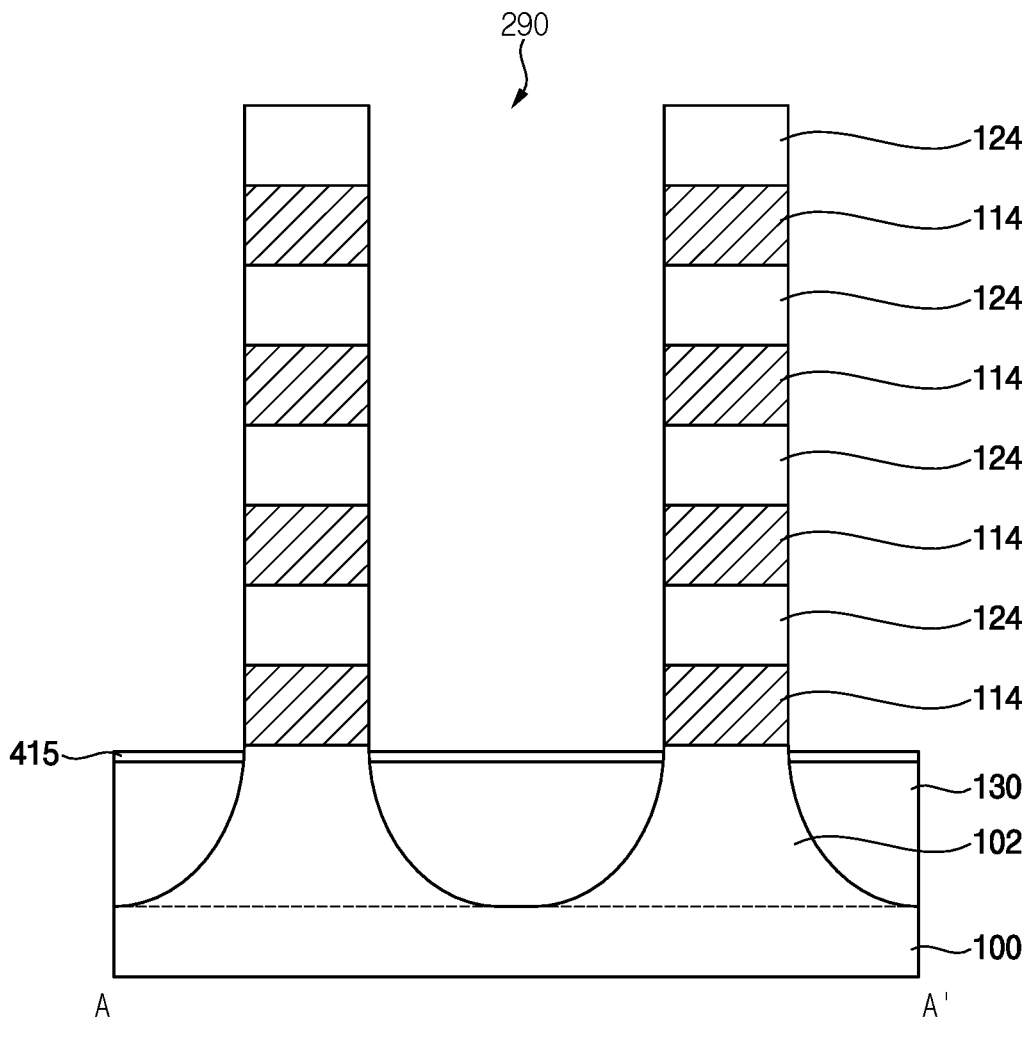
Figure 24:
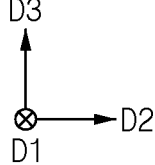
Figure 25:
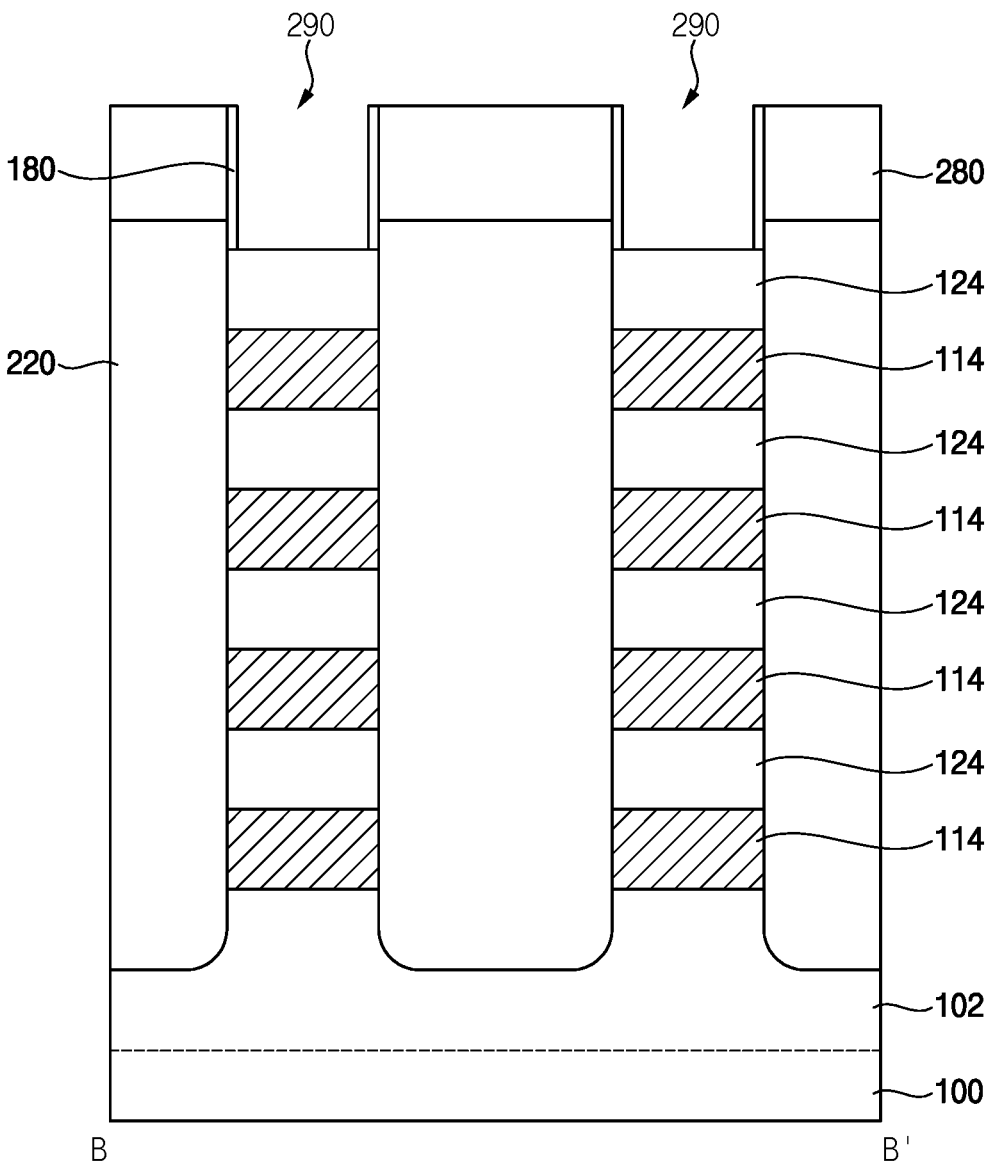
Figure 25:
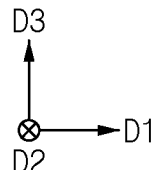
Figure 26:
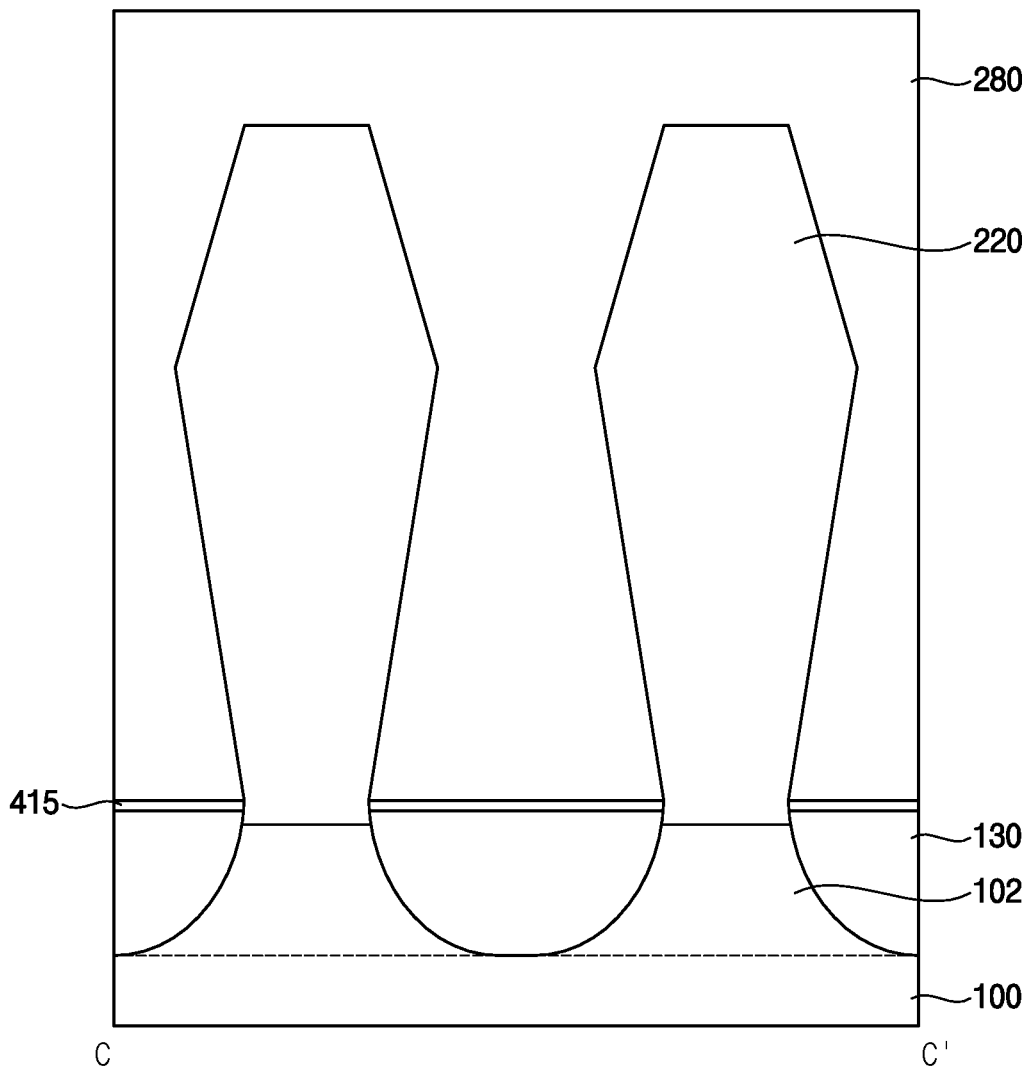
Figure 26:
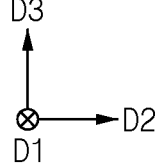

Referring to FIGS. 24 to 26, a first insulating interlayer 280 may be formed on the substrate 100 to cover the first structure and the source/drain layer 220, and may be planarized until the dummy gate electrode 150 of the first structure is exposed.

During the planarization process, the dummy gate mask 160 may also be removed, and an upper portion of the gate spacer 180 may be partially removed.

The exposed dummy gate electrode 150 and the dummy gate insulation pattern 140 may be removed by, e.g., a wet etching process and/or a dry etching process to form a second opening 290 exposing an inner sidewall of the gate spacer 180 and an upper surface of an uppermost one of the semiconductor patterns 124.

An etching selectively between the dummy gate insulation pattern 140 and the isolation pattern 130 may not be large because the dummy gate insulation pattern 140 may include or be formed of an oxide, e.g., silicon oxide, and the isolation pattern 130 may also include an oxide, e.g., silicon oxide. Thus, if the liner 415 does not cover the isolation pattern 130, an upper portion of the isolation pattern 130 may be removed together with the dummy gate insulation pattern 140 to expose a portion of the active pattern 102 covered by the upper portion of the isolation pattern 130, and leakage current may occur through the exposed portion of the active pattern 102. For example, leakage current and parasitic capacitance may be formed by unnecessary channels formed on the exposed portion of the active pattern 102.

However, in example embodiments, the liner 415 may be formed on the isolation pattern 130, and may have a high etching selectively with respect to the isolation pattern 130. Thus, the upper portion of the isolation pattern 130 may remain undamaged, and the leakage current may decrease or prevent and the parasitic capacitance may reduce.

Figure 27:
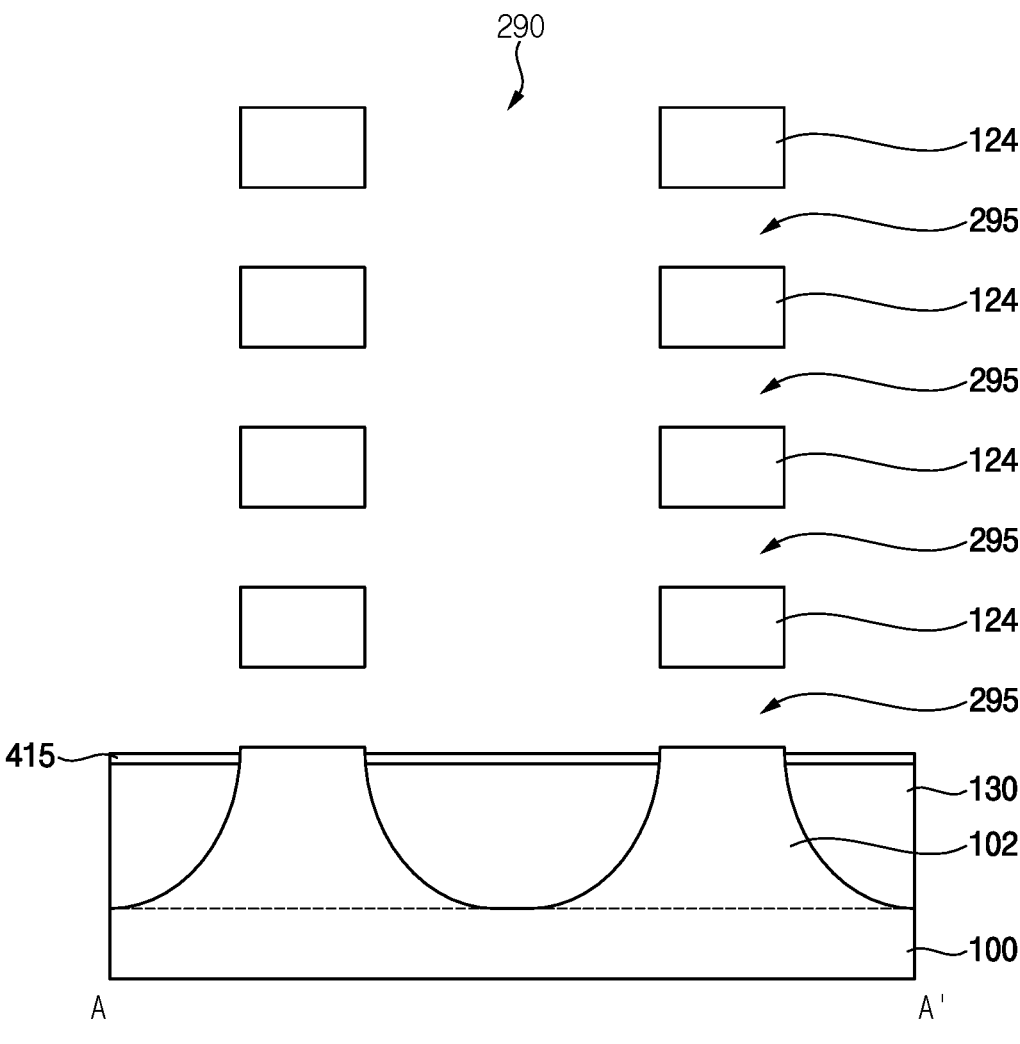
Figure 27:
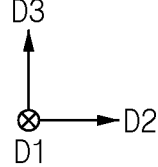
Figure 28:
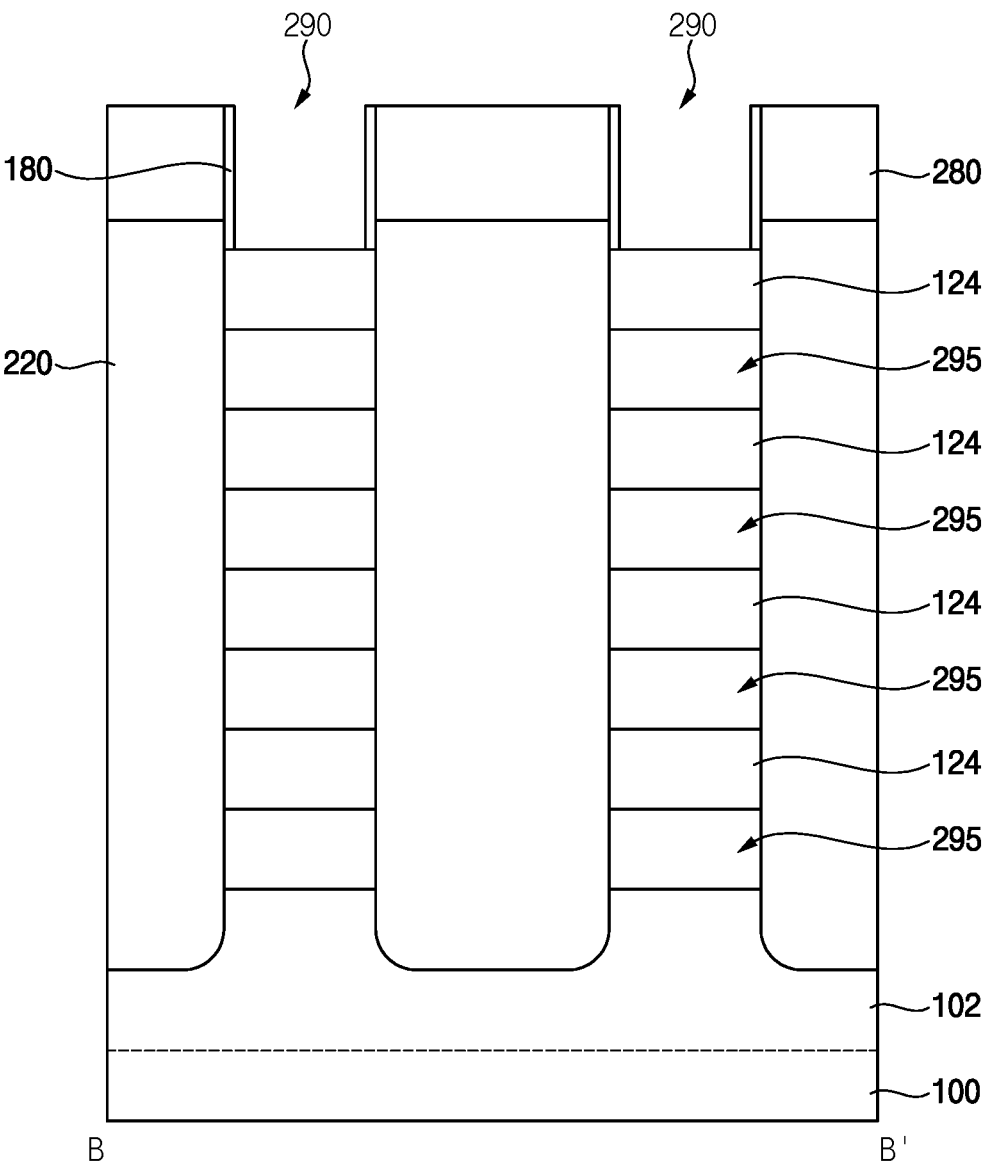
Figure 28:
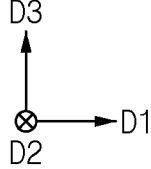

Referring to FIGS. 27 and 28, the sacrificial patterns 114 exposed by the second opening 290 may be removed by, e.g., a wet etching process and/or a dry etching process to form a third opening 295 exposing a sidewall of the source/drain layer 220, surfaces of the semiconductor patterns 124 and the upper surface of the active pattern 102.

Figure 29:
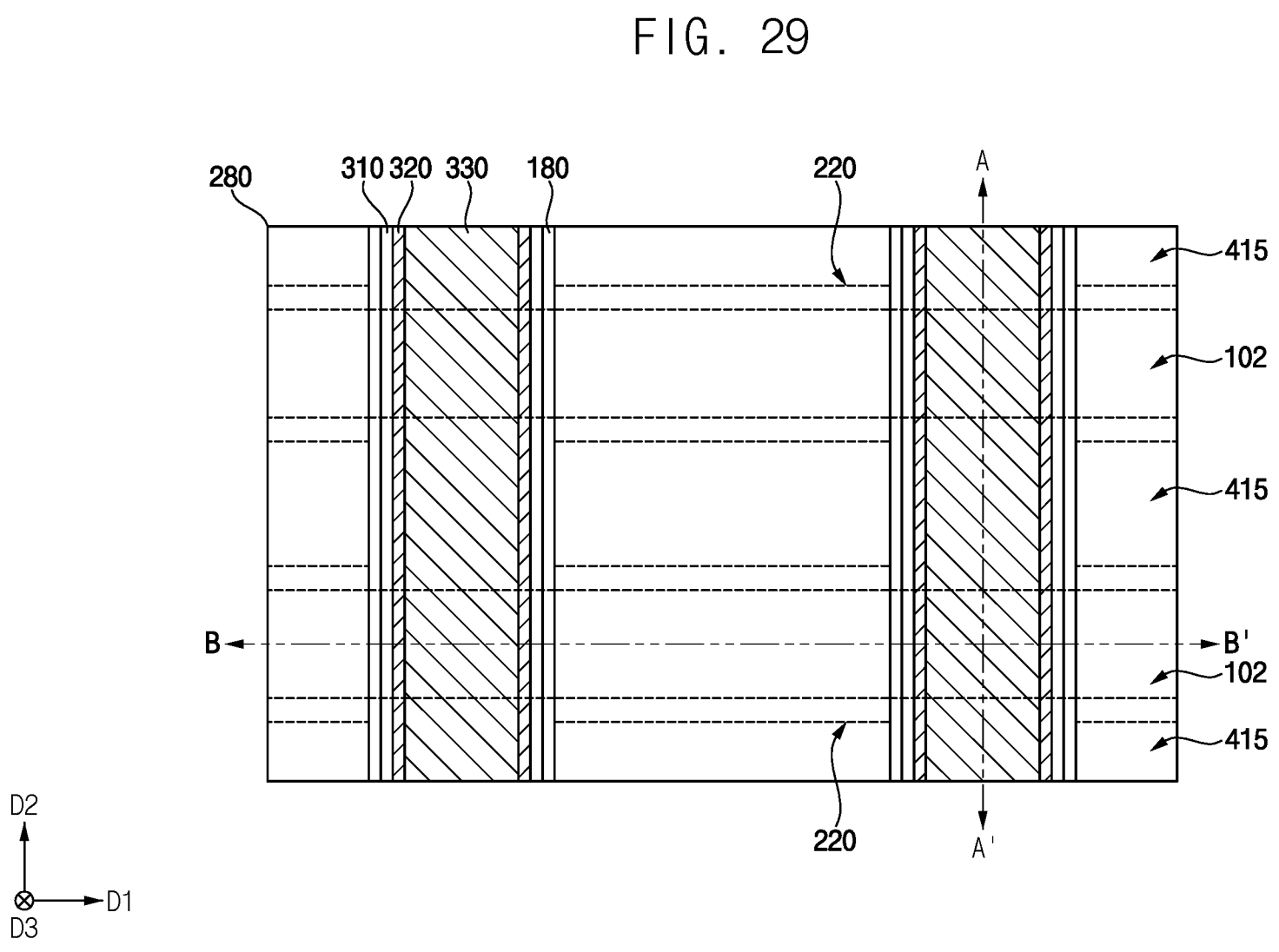
Figure 30:
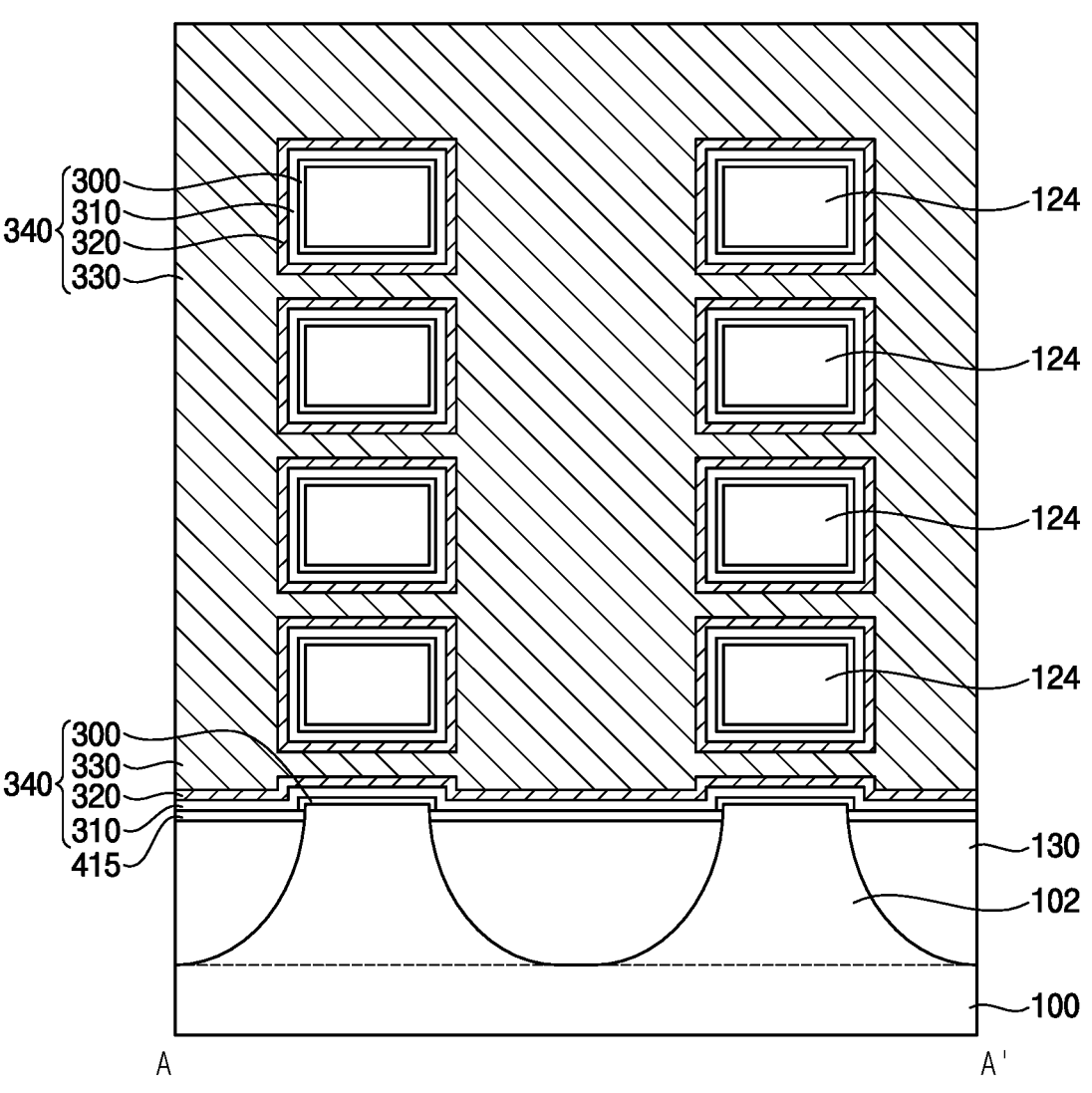
Figure 30:
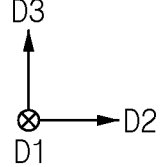
Figure 31:
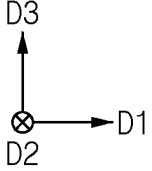

Referring to FIGS. 29 to 31, the gate structure 340 may be formed on the substrate 100 to fill the second and third openings 290 and 295.

Particularly, a thermal oxidation process may be performed on the surfaces of the semiconductor patterns 124 and the sidewall of the source/drain layer 220 exposed by the second and third openings 290 and 295 to form an interface pattern 300, and a gate insulation layer, a gate barrier layer and a gate electrode layer may be sequentially and conformally formed on a surface of the interface pattern 300, the inner sidewall of the gate spacer 180, an upper surface of the gate spacer 180 and an upper surface of the first insulating interlayer 280 to fill remaining portions of the second and third openings 290 and 295.

The gate insulation layer, the gate barrier layer, and the gate electrode layer may be formed by, e.g., a CVD process, an ALD process, a PVD process, etc. In some embodiments, the interface pattern 300 may be formed by a CVD process, an ALD process, etc., instead of the thermal oxidation process, and may also be formed on the inner sidewall and the upper surface of the gate spacer 180 and the upper surface of the first insulating interlayer 280.

The gate electrode layer, the gate barrier layer and the gate insulation layer may be planarized until the upper surface of the first insulating interlayer 280 is exposed, so that a gate electrode 330, a gate barrier 320, and a gate insulation pattern 310 may be formed. The interface pattern 300, the gate insulation pattern 310, the gate barrier 320, and the gate electrode 330 may form the gate structure 340.

In example embodiments, along the second direction D2, the lower surface of the liner 415 may contact the upper surface of the isolation pattern 130 and the upper surface of the liner 415 may contact the lower surface of the gate insulation pattern 310.

In example embodiments, the interface pattern 300 may be formed on the upper surface and the upper sidewall of the active pattern 102, and the liner 415 may be formed lower than the interface pattern 300 in the vertical direction.

In other example embodiments, the interface pattern 300 may be formed on the upper surface of the active pattern 102, and the liner 415 may be formed adjacent to and at the same vertical level as the interface pattern 300.

Referring to FIGS. 1 to 4 again, an upper portion of the gate structure 340 may be removed to form a second recess, and a capping pattern 345 may be formed in the second recess.

A second insulating interlayer 350 may be formed on the capping pattern 345, the gate spacer 180 and the first insulating interlayer 280, a hole may be formed through the first and second insulating interlayers 280 and 350 and an upper portion of the source/drain layer 220, and the contact plug 370 may be formed to fill the hole.

Before the contact plug 370 is formed, a metal silicide pattern 360 may be formed by forming a metal layer on an inner wall of the hole and performing heat treatment process on the upper portion of the source/drain layer 220 exposed by the hole.

The semiconductor device may be manufactured by the above processes.

As described above, the liner layer 410 may be formed on the surfaces of the isolation pattern 130, the active pattern 102 and the stack structure, the sacrificial oxide layer 420 may be formed on the line layer 410, and the planarization process may be performed until the upper surface of the stack structure is exposed.

The portion of the liner layer 410 on the sidewall of the stack structure may be removed to form the liner 415.

After the sacrificial oxide layer 420 is removed, the dummy gate structure 170 may be formed to partially cover the stack structure and the liner 415, the source/drain layer 220 may be formed, and the dummy gate electrode 150 and the dummy gate insulation pattern 140 included in the dummy gate structure 170 may be removed.

The liner 415 having a high etching selectivity with respect to the gate insulation pattern 140 may be formed on the upper surface of the isolation pattern 130, and thus the upper portion of the isolation pattern 130 may not be removed or damaged while removing the dummy gate insulation pattern 140. Accordingly, the active pattern 102 covered by the isolation pattern 130 may not be exposed, and leakage current caused by the exposure of the active pattern 102 may be prevented.

Figure 32:
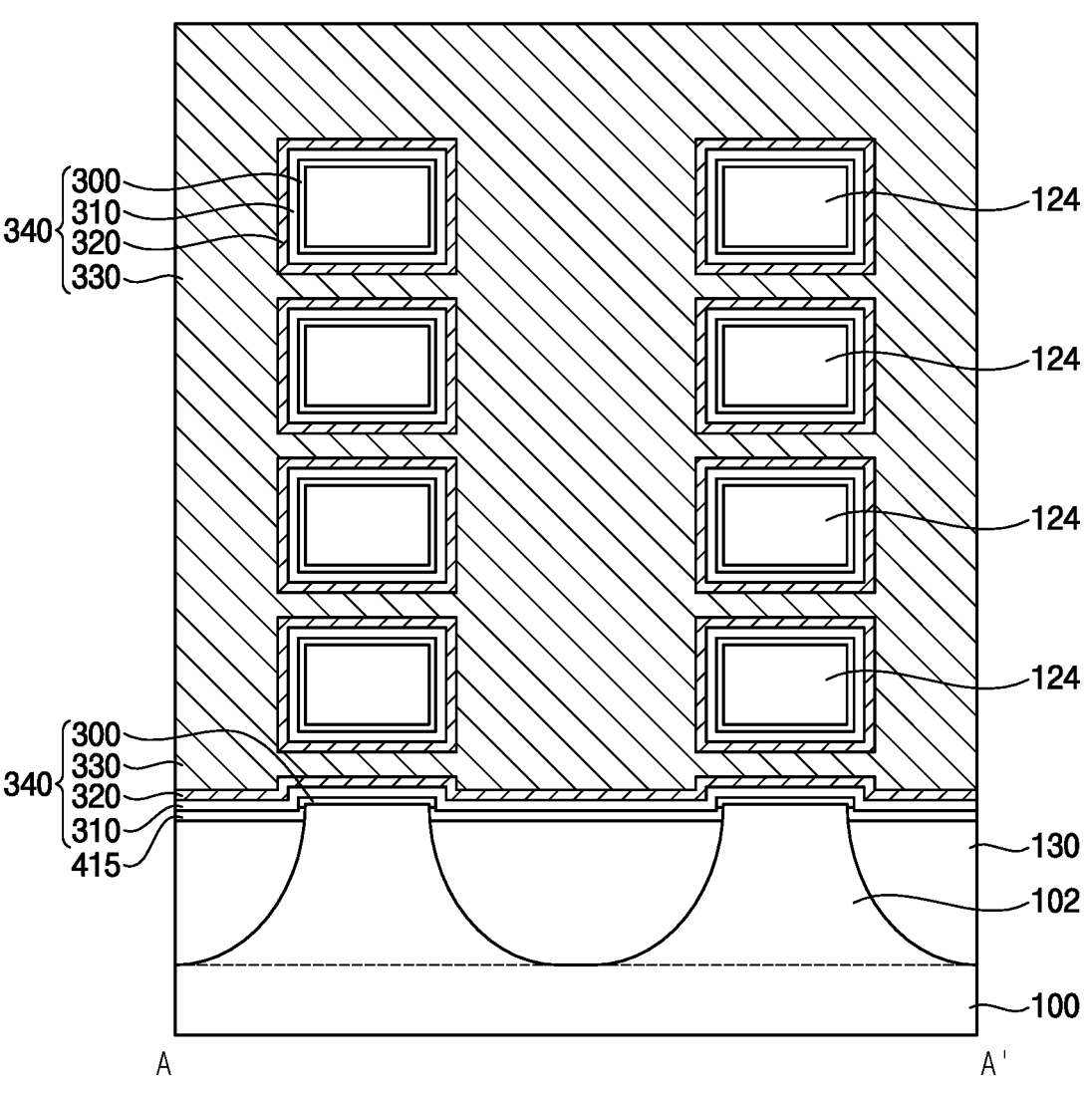
FIGS. 32 and 33 are a plan view and cross-sectional views illustrating a semiconductor device according to example embodiments.
Figure 32:
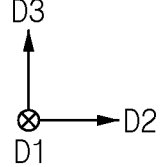
Figure 33:
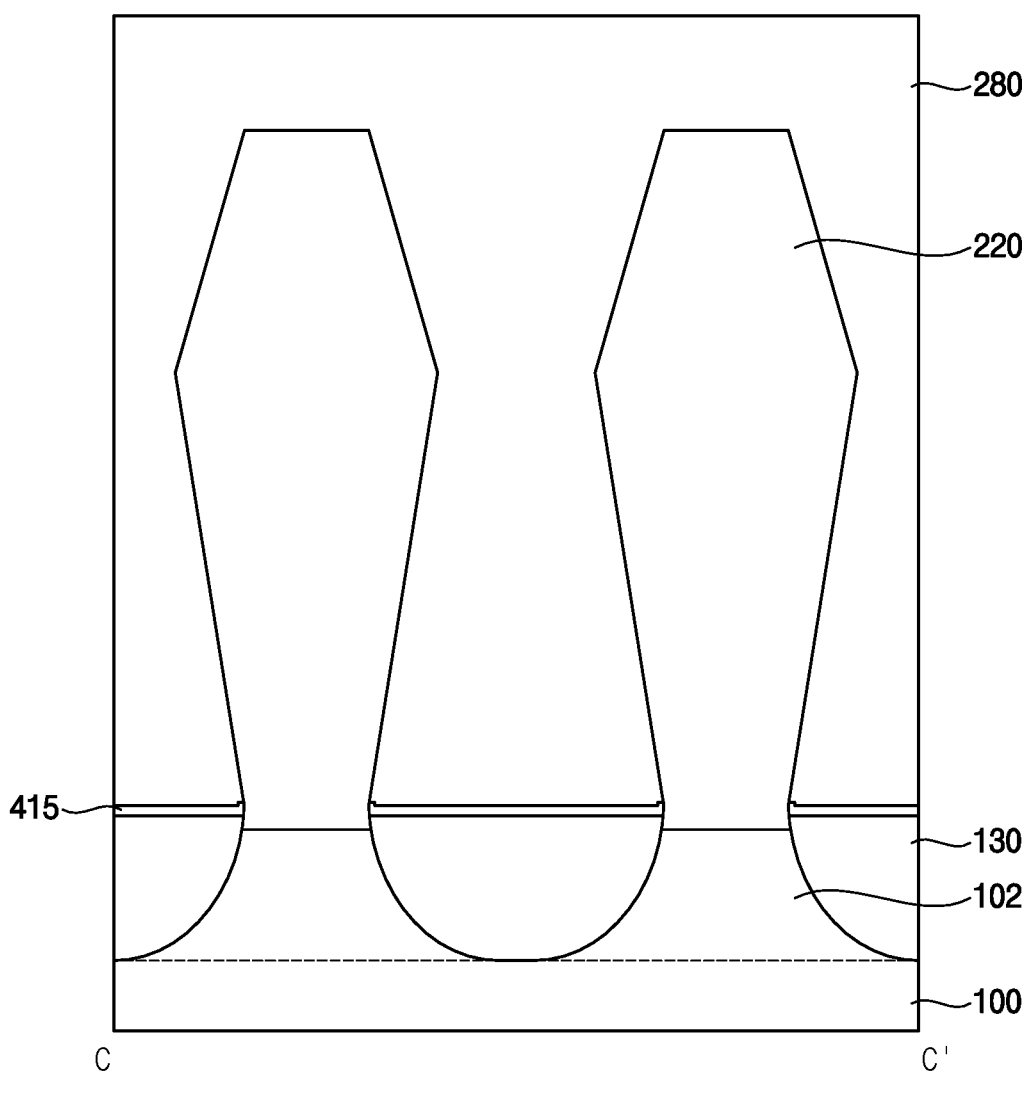
Figure 33:
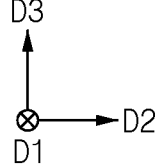

FIGS. 32 and 33 are cross-sectional views illustrating a semiconductor device in accordance with example embodiments, which may correspond to FIGS. 2 and 4, respectively.

Referring to FIGS. 32 and 33, the semiconductor device may be substantially the same as or similar to that of FIGS. 1 to 4, except for the shape of the liner 415, and like reference numerals refer to like elements, and repeated descriptions thereof are omitted herein.

A portion of the liner 415 adjacent to the active pattern 102 in the second direction D2 may protrude in the third direction D3.

Accordingly, upper surfaces of edge portions in the second direction D2 of the liner 415 may be higher than an upper surface of a middle portion in the second direction D2 of the liner 415.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
an active pattern on a substrate;
an isolation pattern on the substrate, the isolation pattern covering opposite sidewalls of the active pattern;
a liner on the isolation pattern, the liner including a material different from a material of the isolation pattern;
a gate structure disposed on an upper surface of the active pattern and an upper surface of the liner; and
a plurality of channels spaced apart from each other in a vertical direction perpendicular to an upper surface of the substrate, each of the plurality of channels extending through the gate structure,
wherein the gate structure includes a gate insulation pattern and a gate electrode sequentially stacked on the upper surface of the liner, and
wherein the liner contacts an upper portion of each of the opposite sidewalls of the active pattern.

2. The semiconductor device according to claim 1, wherein the isolation pattern includes silicon oxide (SiO$_2$), and
wherein the liner includes silicon nitride (SiN), silicon oxycarbide (SiOC) or silicon oxycarbonitride (SiOCN).

3. The semiconductor device according to claim 2, wherein the liner includes silicon nitride (SiN), and
wherein a concentration of nitrogen in the liner is constant along the vertical direction.

4. The semiconductor device according to claim 2, wherein the liner includes silicon oxycarbide (SiOC) or silicon oxycarbonitride (SiOCN), and
wherein a concentration of carbon in the liner is constant along the vertical direction.

5. The semiconductor device according to claim 1, wherein the active pattern extends in a first direction parallel to the upper surface of the substrate,
wherein the isolation pattern covers the opposite sidewalls of the active pattern in a second direction, the second direction being parallel to the upper surface of the substrate and crossing the first direction, and
wherein the gate structure extends in the second direction on the active pattern and the liner.

6. The semiconductor device according to claim 5, wherein an uppermost surface of a portion of the liner under the gate structure is at the same height as or lower than an upper surface of a portion of the active pattern adjacent to the portion of the liner in the second direction.

7. The semiconductor device according to claim 6, wherein the upper surface of the liner has a constant height.

8. The semiconductor device according to claim 6, wherein the portion of the liner adjacent to the active pattern protrudes in the vertical direction.

9. The semiconductor device according to claim 6, wherein upper surfaces of edge portions in the second direction of the liner are higher than an upper surface of a middle portion in the second direction of the liner.

10. The semiconductor device according to claim 1, wherein the gate structure further includes a gate barrier between the gate insulation pattern and the gate electrode.

11. The semiconductor device according to claim 10, wherein the gate insulation pattern includes a metal oxide.

12. The semiconductor device according to claim 1 further comprising:
a source/drain layer on a portion of the active pattern adjacent to the gate structure, the source/drain layer contacting the plurality of channels,
wherein the liner covers a portion of a sidewall of the source/drain layer.

13. A semiconductor device comprising:
an active pattern on a substrate, the active pattern extending in a first direction parallel to an upper surface of the substrate;
an isolation pattern on the substrate, the isolation pattern covering opposite sidewalls in a second direction of the active pattern, the second direction being parallel to the upper surface of the substrate and crossing the first direction;
a liner on the isolation pattern, the liner extending in the first direction;
a gate structure on the active pattern and the liner, the gate structure extending in the second direction;
a plurality of channels spaced apart from each other in a vertical direction perpendicular to the upper surface of the substrate, each of the plurality of channels extending through the gate structure; and
a source/drain layer on a portion of the active pattern adjacent to the gate structure in the first direction, the source/drain layer contacting the plurality of channels,
wherein the liner includes a material of silicon oxycarbide (SiOC), and a concentration of carbon in the liner is constant along the vertical direction,
wherein the gate structure includes a gate insulation pattern and a gate electrode sequentially stacked on the liner, and
wherein the liner contacts an upper portion of each of the opposite sidewalls of the active pattern.

14. The semiconductor device according to claim 13, wherein an uppermost surface of a portion of the liner under the gate structure is at the same height as or lower than an upper surface of a portion of the active pattern adjacent to the portion of the liner in the second direction.

15. The semiconductor device according to claim 14, wherein an upper surface of the liner has a constant height.

16. The semiconductor device according to claim 14, wherein upper surfaces of edge portions in the second direction of the liner are higher than an upper surface of a middle portion in the second direction of the liner.

17. The semiconductor device according to claim 13, wherein the gate structure further includes a gate barrier between the gate insulation pattern and the gate electrode, and wherein the gate insulation pattern includes a metal oxide.

18. A semiconductor device comprising:

an active pattern on a substrate, the active pattern extending in a first direction parallel to an upper surface of the substrate;

an isolation pattern on the substrate, the isolation pattern covering opposite sidewalls in a second direction of the active pattern, and the second direction being parallel to the upper surface of the substrate and crossing the first direction;

a liner on the isolation pattern, the liner extending in the first direction;

a gate structure on the active pattern and the liner, the gate structure extending in the second direction;

a plurality of channels spaced apart from each other in a vertical direction perpendicular to the upper surface of the substrate, each of the plurality of channels extending through the gate structure; and a source/drain layer on a portion of the active pattern at each of opposite sides of the gate structure in the first direction, the source/drain layer contacting the plurality of channels,

wherein the gate structure includes a gate insulation pattern and a gate electrode sequentially stacked on the liner, wherein each of edge portions in the second direction of the liner:

protrudes in the vertical direction, and is higher than an upper surface of a middle portion in the second direction of the liner, and wherein the liner contacts an upper portion of each of the opposite sidewalls of the active pattern.

19. The semiconductor device according to claim 18, wherein:

the isolation pattern includes silicon oxide (SiO$_2$), the liner includes silicon nitride (SiN), and a concentration of nitrogen in the liner is constant along the vertical direction.

20. The semiconductor device according to claim 18, wherein:

the isolation pattern includes silicon oxide (SiO$_2$), the liner includes silicon oxycarbide (SiOC) or silicon oxycarbonitride (SiOCN), and a concentration of carbon in the liner is constant along the vertical direction.

* * * * *